(12) United States Patent
Noguchi et al.

(10) Patent No.: US 6,905,785 B2
(45) Date of Patent: Jun. 14, 2005

(54) POLYMERIC FLUORESCENT SUBSTANCE, PRODUCTION THEREOF AND POLYMER LIGHT-EMITTING DEVICE

(75) Inventors: Takanobu Noguchi, Tsukuba (JP); Yoshiaki Tsubara, Tsukuba (JP); Shuji Doi, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 235 days.

(21) Appl. No.: 10/062,223

(22) Filed: Feb. 4, 2002

(65) Prior Publication Data

US 2002/0177687 A1 Nov. 28, 2002

(30) Foreign Application Priority Data

Feb. 5, 2001 (JP) .................................. 2001-028001
Mar. 14, 2001 (JP) .................................. 2001-071776

(51) Int. Cl.$^7$ .................. B32B 19/00; G02F 1/1335; H05B 33/14
(52) U.S. Cl. ................... 428/690; 428/1.1; 428/691; 428/917; 313/504; 313/506; 349/69; 252/301.16; 528/86; 528/125; 528/373; 528/377; 528/391; 528/397; 528/422; 528/491; 528/494; 528/498
(58) Field of Search ................... 428/690, 691, 428/917, 1.1, 457, 474.4, 411.1; 313/504, 506–507, 509; 349/69; 252/301.16; 528/86, 125, 391, 397, 373, 377, 422, 491, 494, 498, 176, 327

(56) References Cited

U.S. PATENT DOCUMENTS

| 6,107,452 | A | * | 8/2000 | Miller et al. ................. 528/422 |
| 6,521,359 | B1 | * | 2/2003 | Noguchi et al. ............. 428/690 |
| 6,565,994 | B2 | * | 5/2003 | Igarashi ....................... 428/690 |
| 6,720,091 | B2 | * | 4/2004 | Ohnishi et al. ............. 428/690 |

FOREIGN PATENT DOCUMENTS

| EP | 1 138 746 A1 | 10/2001 |
| EP | 1 168 891 A1 | 1/2002 |
| JP | 5-70565 A | 3/1993 |
| JP | 2000-44544 A | 2/2000 |
| WO | WO 99/20675 A1 | 4/1999 |
| WO | WO 01/42331 A1 | 6/2001 |

OTHER PUBLICATIONS

S. Tokito et al., "Polymer EL Device of Polyfluorene Derivative", *Monthly Display*, Nov., 2000, pp. 26–32, with English translation.

S. Setayesh et al., "Bridging the Gap between Polyfluorene and Ladder–Poly–*p*–phenylene: Synthesis and Characterization of Poly–2,8–indenofluorene", *Macromolecules*, vol. 33, 2000, p. 2016–2020.

T. Yamamoto et al., "Preparation and properties of π–conjugated poly(benzimidazole–4,7–diyl)s", Macromolecular Chemistry and Physics, vol. 199, No. 9, (Sep. 1, 1998), pp. 1807–1813.

T. Yamamoto et al., "Preparation of π–Conjugated Poly(thiophene–2,5–diyl), Poly(*p*–phenylene), and Related Polymers Using Zerovalent Nickel Complexes. Linear Structure and Properties of the π–Conjugated Polymers", Macromolecules, American Chemical Society, vol. 25, No. 4, (Feb. 17, 1992), pp. 1214–1223 with Abstract.

T. Yamamoto et al., "π–Conjugated Poly(pyridine–2, 5–diyl), Poly(2–2'–bipyridine–5,5'–diyl), and Their Alkyl Derivatives. Preparation, Linear Structure, Function as a Ligand to Form Their Transition Metal Complexes, Catalytic Reactions, n–Type Electrically Conducting Properties, Optical Properties, and Alignment on Substrates", Journal of American Chemical Society, vol. 116, (1994), pp. 4832–4845 with Abstract.

Takakazu Yamamoto, Kiyoshi Sugiyama, Takaki Kanbara, Hideki Hayashi and Hideki Etori, Preparation and Properties of π–Conjugated Poly(benzimidazole–4,7–diyl)s, Macromol. Chem. Phys. 199, 1807–1813 (1998).

Copy of Office Action from the Taiwanese Patent Office dated Apr. 27, 2004.

* cited by examiner

*Primary Examiner*—P. Hampton Hightower
(74) *Attorney, Agent, or Firm*—Sughrue Mion, PLLC

(57) ABSTRACT

Provided is a method of producing a polymeric fluorescent substance wherein one or more monomers represented by the general formula (1) are polymerized in the presence of a zerovalent nickel complex, $$X_1-Ar_1-X_2 \qquad (1)$$

wherein, $Ar_1$ represents a divalent group selected from the group consisting of arylene groups, divalent heterocyclic compound groups, and divalent or trivalent hetero atom-bonded arylene or divalent heterocyclic compound groups, and $X_1$ and $X_2$ represent leaving groups. By using the polymeric fluorescent substance, a high performance polymer LED can easily be obtained.

43 Claims, No Drawings

POLYMERIC FLUORESCENT SUBSTANCE, PRODUCTION THEREOF AND POLYMER LIGHT-EMITTING DEVICE

BACKGROUND OF THE INVENTION

1. Field of the Invention

The present invention relates to a method of producing a polymeric fluorescent substance and a polymer light-emitting device (hereinafter, sometimes referred to as polymer LED) using the same.

2. Description of the Related Art

Light-emitting materials having high molecular weight (polymeric fluorescent substances) are, differing from those having low molecular weight, soluble in a solvent and can form a light-emitting layer in a light emitting device by a coating method, consequently, have been variously investigated, and for example, there are disclosed polyarylene-based polymeric fluorescent substances such as polyfluorene (Jpn. J. Appl. Phys., vol. 30, L 1941 (1991)), poly-p-phenylene derivatives (Adv. Mater., vol. 4, p. 36 (1992)) and the like.

As a method of producing a polyarylene-based polymeric fluorescent substance, a method is known in which a dihalogenated arylene of the formula:

(X represents a halogen atom and Ar represents an arylene group) is polymerized in the presence of a zerovalent nickel complex. For example, there is a disclosure in which 9,9-dioctyl-2,7-dibromofluorene is polymerized in the presence of $Ni(COD)_2$ in a tetrahydrofuran solvent to obtain poly-dioctylfluorene (weight-average molecular weight: 54000) (Tokito et al., Monthly Display, pages 26–32 (2000), TechnoTimes Co., Ltd.).

However, the molecular weight of a polyarylene-based fluorescent polymer produced by the above-mentioned conventional method is not sufficiently high yet, and there has been demanded for a method which can produce those having further higher molecular weight.

An object of the present invention is to provide a method in which an arylene-based monomer having two leaving groups such as dihalogenated arylenes and the like is polymerized in the presence of a zerovalent nickel complex to produce a polyarylene-based fluorescent polymer having high molecular weight; a polymeric fluorescent substance produced by the method; and a polymer LED which can be driven at low voltage and at high efficiency using the polymeric fluorescent substance.

SUMMARY OF THE INVENTION

The present invention relates to a method of producing a polymeric fluorescent substance wherein one or more monomers represented by the general formula (1) are polymerized in a solvent containing one or more aromatic hydrocarbon solvents and/or ether solvents in the presence of a zerovalent nickel complex in an amount of 1.8 mol or more based on 1 mol of said monomers,

wherein, $Ar_1$ represents a divalent group selected from the group consisting of arylene groups, divalent heterocyclic compound groups, and divalent or trivalent hetero atom-bonded arylene or divalent heterocyclic compound groups; $Ar_1$ may have one or more substituents; $X_1$ and $X_2$ represent leaving groups which may be the same or different.

Further, the present invention relates to a polymeric fluorescent substance produced by the above method.

Also, the present invention relates to a polymer light emitting device comprising at least a light emitting layer between a pair of electrodes composed of an anode and a cathode at least one of which is transparent or semi-transparent wherein the light emitting layer comprises the above polymeric fluorescent substance.

Further, the present invention relates to a flat light source, a segment display, and a dot matrix display, obtained by using the above polymer light emitting device. Furthermore, the present invention relates to a liquid crystal display obtained by using the above polymer light emitting device as aback-light.

DETAILED DESCRIPTION OF THE INVENTION

In the production method of the present invention, one or more monomers represented by the general formula (1) are polymerized.

In the above-described formula (1), $X_1$ and $X_2$ represent a leaving group, and preferable is a halogen atom, an alkylsulfonyloxy group which may be substituted by one or more fluorine atoms or an arylsulfonyloxy group which may be substituted by one or more alkyl groups, more preferable-is a halogen atom.

Examples of the halogen atom include a chlorine atom, bromine atom and iodine atom, and owing to high reactivity, a chlorine atom and bromine atom are preferable, and a bromine atom is particularly preferable.

As the alkylsulfonyloxy group which may be substituted by one or more fluorine atoms, a trifluoromethylsulfonyloxy group and ethylsulfonyloxy group are listed, and as the arylsulfonyloxy group which may be substituted by one or more alkyl groups, a phenylsulfonyloxy group and tolylsulfonyloxy group are listed, and of them, a trifluoromethylsulfonyloxy group is preferable owing to high reactivity.

$X_1$ and $X_2$ may be the same or different, and it is preferable that they are the same from the standpoint of easy production.

In the production method of the present invention, the solvent contains one or more aromatic hydrocarbon solvents and/or ether solvents, and aromatic hydrocarbon solvents are preferable from the standpoint of cost.

Here, the aromatic hydrocarbon solvent is a solvent composed of an aromatic hydrocarbon compound, and examples thereof include benzene, toluene, xylene, trimethylbenzene, tetramethylbenzene, butylbenzene, naphthalene, tetralin and the like. In order to obtain a polymer having high molecular weight, toluene, xylene, tetralin and tetramethylbenezene which are a good solvent for a polymeric fluorescent substance are preferable since the polymer can be sufficiently dissolved, and toluene is particularly preferable from the standpoints of universal use and cheapness.

The ether solvent is a solvent composed of a compound in which hydrocarbon groups are connected by an oxygen atom, and examples thereof include diisopropyl ether, tetrahydrofuran, 1,4-dioxane, diphenyl ether, ethylene glycol dimethyl ether, tert-butyl methyl ether and the like. In the case of obtaining a polymer having high molecular weight, tetrahydrofuran, 1,4-dioxane and the like which are a good solvent for a polymeric fluorescent substance are preferable, and tetrahydrofuran is particularly preferable.

Further, from the standpoint of improvement in polymerization property and solubility, mixed solvents of aromatic hydrocarbon solvents and/or ether solvents with solvents other than aromatic hydrocarbon solvents and ether solvents may also be used. As the solvent other than aromatic hydrocarbon solvents and ether solvents, for example, ester solvents and amide solvents are listed. In this case, the amount of the solvent other than aromatic hydrocarbon solvents and ether solvents is usually 1 to 90% by weight and the total amount of aromatic hydrocarbon solvents and/or ether solvents is 99 to 10% by weight.

As the zerovalent nickel complex used in the production method of the present invention, bis(1,5-cyclooctadiene) nickel (0), (ethylene)bis(triphenylphosphine)nickel (0), tetrakis(triphenylphosphine)nickel and the like are exemplified, and of them, bis(1,5-cyclooctadiene)nickel (0) is preferable from the standpoints of universal use and cheapness.

Further, addition of a neutral ligand is preferable from the standpoints of improvement in yield and increase in molecular weight.

Here, the neutral ligand is a ligand having neither anion nor cation, and nitrogen-containing ligands such as 2,2'-bipyridyl, 1,10-phenanthroline, methylenebisoxazoline, N,N'-tetramethylethylenediamine and the like; tertiary phosphine ligands such as triphenylphosphine, tritolylphosphine, tributylphosphine, triphenoxyphosphine and the like; and other ligands are exemplified, and nitrogen-containing ligands are preferable from the standpoints of universal use and cheapness and 2,2'-bipyridyl is particularly preferable from the standpoints of high reactivity and high yield.

Particularly, a system prepared by adding 2,2'-bipyridyl as a neutral ligand to a system containing bis(1,5-cyclooctadiene)nickel (0) is preferable from the standpoint of increase in the molecular weight of a polymer.

Reactions and operations in the method of producing a polymeric fluorescent substance of the present invention can be carried out, for example, according to the method described in JP-A No. 2000-44544.

In the present invention, a polymerization reaction is usually carried out, for example, in an inert gas atmosphere such as argon, nitrogen and the like.

The amount of a zerovalent nickel complex is 1.8 mol or more, preferably 2.1 mol or more, further preferably 2.3 mol or more based on 1 mol of monomers of the formula (1). When the amount is too small, the molecular weight tends to be small. Though the upper limit is not restricted, the amount is preferably 5.0 mol or less since a work-up operation tends to be difficult when the amount is too large.

In the case of use of a neutral ligand, the amount thereof is usually from about 0.5 to 10 mol based on 1 mol of a zerovalent nickel complex, and preferably from 0.9 to 1.1 mol from the standpoint of economy.

The amount of monomers of the formula (1) is not particularly restricted providing a usual polymerization progresses, and in the case of too low concentration of the monomers, good yield of a produced polymeric fluorescent substance may become difficult to attain, and in the case of too high concentration of the monomers, stirring may become difficult. Therefore, the amount of monomers is preferably 0.05% by weight or more and 40% by weight or less, more preferably 0.1% by weight or more and 25% by weight or less based on 100% by weight of the total amount of a solvent, monomers of the formula (1) and zerovalent nickel complex.

The polymerization time is usually from about 0.5 to 100 hours, and preferably within 10 hours from the standpoint of production cost.

The polymerization temperature is usually from 0 to 200° C., and preferably from 20 to 100° C. from the standpoints of high yield and low heating cost.

In the production method of the present invention, a polymer may also be subjected, after completion of the reaction, to conventional separation and/or purification operations such as treatment with acid, alkali water, and/or organic solvent, neutralization, re-precipitation, centrifugal separation, extraction, column chromatography and the like, drying and other operations, if necessary.

When the polymeric fluorescent substance of the present invention is used as a light-emitting material of a polymer LED, the purity thereof exerts an influence on light-emitting property. Therefore, in the production method of the present invention, it is preferable to sufficiently carry out the above-mentioned separation operations and purification operations to remove unreacted monomers, by-products, residue of zerovalent nickel complex and the like sufficiently.

In the case of drying, conditions in which a remaining solvent is sufficiently removed may be recommendable. For prevention of deterioration of a polymeric fluorescent substance, it is preferable to dry in an inert and dark atmosphere. Further, it is preferable to dry at under deterioration temperature of a polymeric fluorescent substance.

The polymeric fluorescent substance obtained by the method of the present invention usually shows fluorescence in solid state, and has a polystyrene reduced weight-average molecular weight of usually from $10^3$ to $10^8$, preferably from $10^4$ to $10^7$, further preferably from $6 \times 10^4$ to $10^7$.

The polystyrene reduced number-average molecular weight thereof is usually from $10^2$ to $10^7$, preferably from $10^3$ to $10^6$, further preferably from $6 \times 10^3$ to $10^6$.

The above-mentioned polymeric fluorescent substance contains one or more kinds of repeating units represented by the formula (2) described below derived from raw material monomers, and the total amount of these repeating units is usually 10 mol % or more and 100 mol % or less, more preferably 30 mol % or more and 100 mol % or less, further preferably 50 mol % or more and 100 mol % by less based on the total amount of all repeating units.

$$-Ar_1- \qquad (2)$$

The total number of repeating units of the above-mentioned polymeric fluorescent substance differs depending on the repeating unit, ratio thereof and a treatment method after polymerization. From the standpoint of film forming property, the total number of repeating units is preferably from 20 to 10000, further preferably from 30 to 10000, particularly preferably from 50 to 10000.

In the above-mentioned formula (1) or (2), $Ar_1$ represents a divalent group selected from the group consisting of arylene groups; divalent heterocyclic compound groups; and divalent or trivalent hetero atom-bonded arylene or divalent heterocyclic compound groups. $Ar_1$ may have one or more substituents. The number of carbon atoms in $Ar_1$ is usually not more than 60, and preferably less than 40. When the carbon number is too large, increase in molecular weight of a polymeric fluorescent substance tends to be insufficient. The number of carbon atoms in $Ar_1$ does not include the carbon number of substituents.

As $Ar_1$, arylene groups and divelent heterocyclic compound groups contained in all the material which are utilized as an EL light emitting material may be available. These materials are disclosed, for example, in WO99/12989, WO00/55927, WO01/49769A1, WO01/49768A2, WO98/06773, U.S. Pat. No. 5,777,070, WO99/54385, WO00/

46321 and U.S. Pat. No. 6,169,163B1. But $Ar_1$ used in the present invention is not restricted thereto.

The arylene group includes those having a benzene ring, a fused ring, and those in which independent benzene rings and/or fused rings are bonded directly or through groups such as vinylene. The arylene group has usually 6 to 60 carbon atoms, and preferably 6 to 20.

Examples thereof include: phenylene groups (for example, the below structures of Nos. 1 to 3), naphthalene-diyl groups (the below structures of Nos. 4 to 13), anthracenylene groups (the below structures of Nos. 14 to 19), biphenylene groups (the below structures of Nos. 20 to 25), triphenylene groups (the below structures of Nos. 26 to 28), stilbene-diyl (the below structures of A to D), distilbene-diyl (the below structures of E and F), fused ring compound groups (the below structures of Nos. 29 to 38), etc. Here, the number of carbon atoms of the substituent is not counted as the number of carbon atoms of the arylene group.

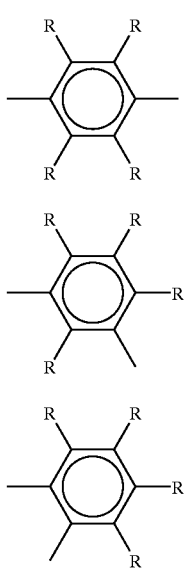

1

2

3

4

5

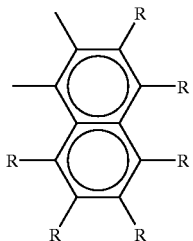

6

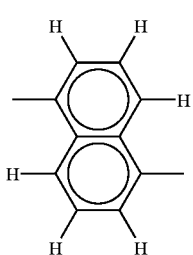

7

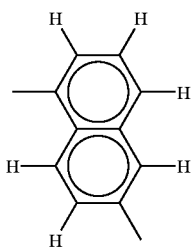

8

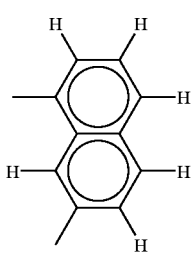

9

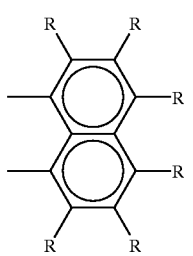

10

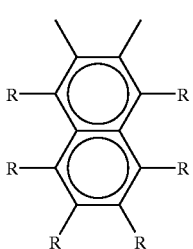

11

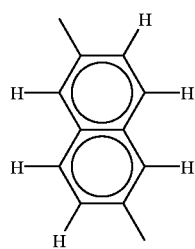 12
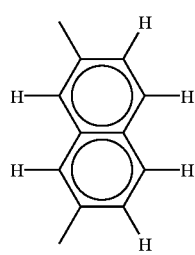 13
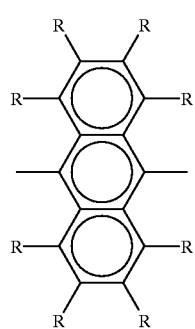 14
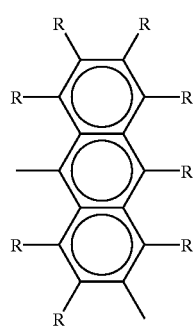 15
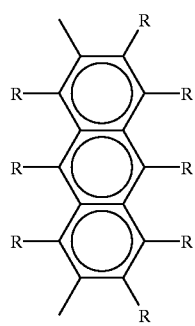 16
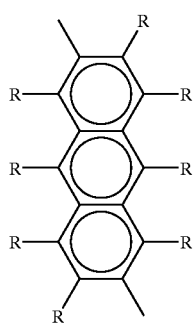 17
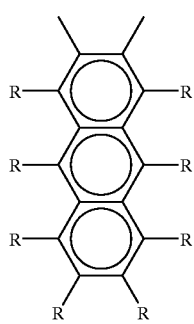 18
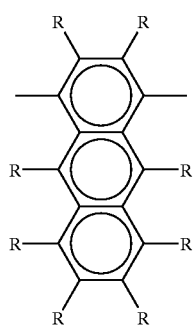 19
 20
 21
 22

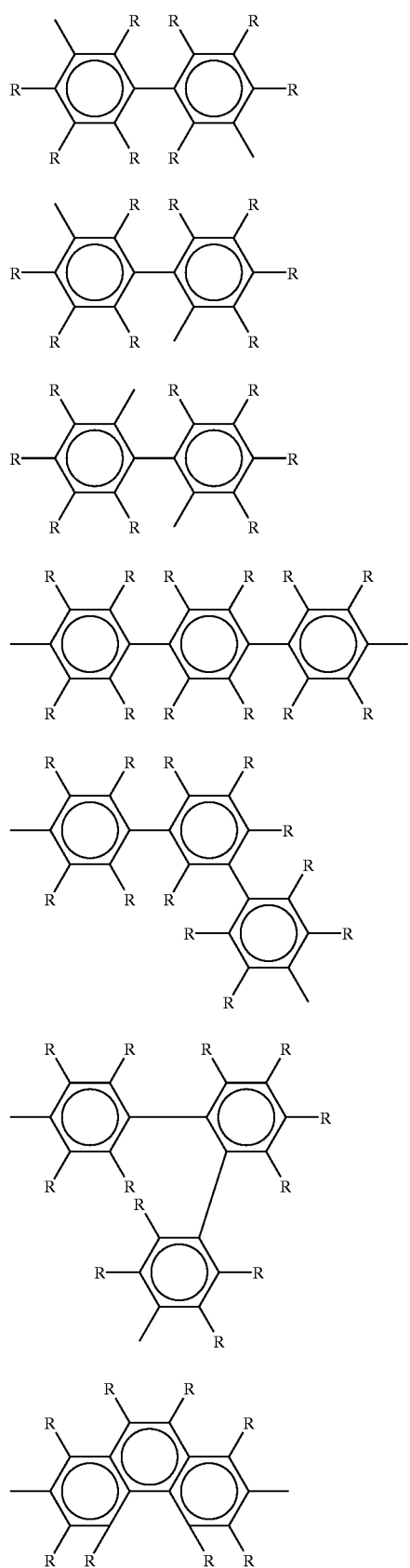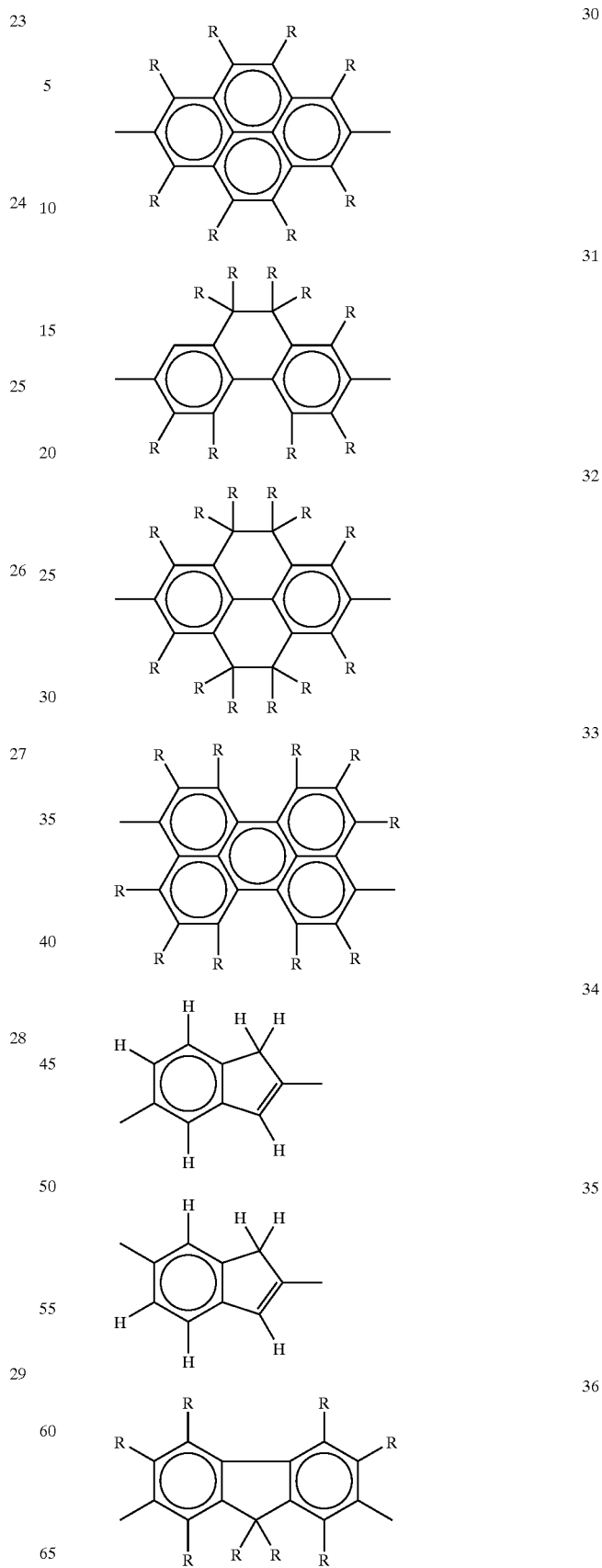

37

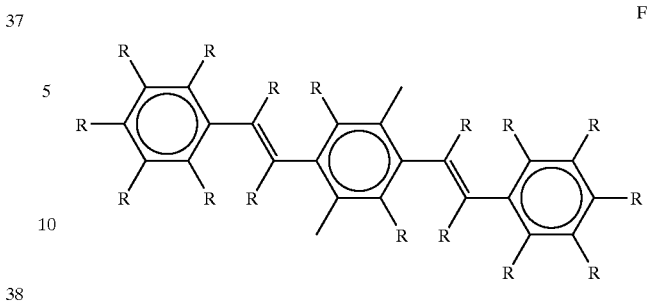

38

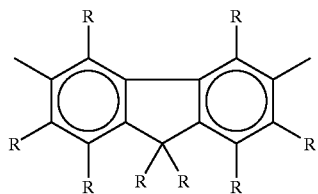

A

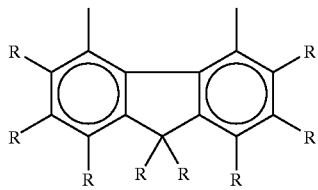

B

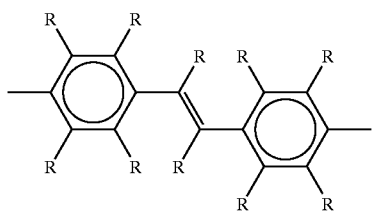

C

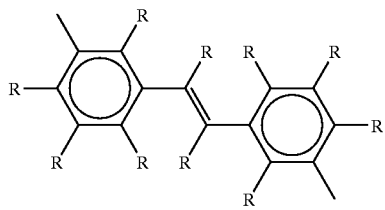

D

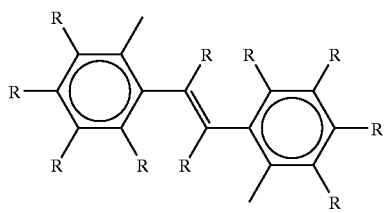

E

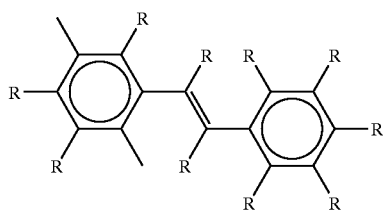

F

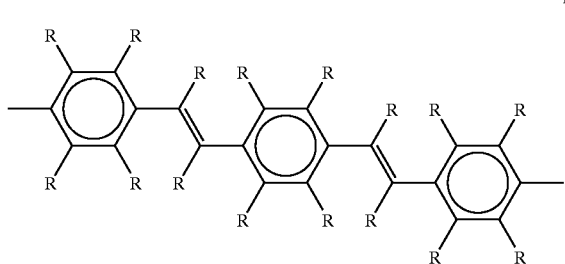

The divalent heterocyclic compound group means an atomic group of a heterocyclic compound in which two hydrogen atoms are removed, and has usually about 3 to 60, preferably 4 to 20 carbon atoms. Here, the number of carbon atoms of the substituent is not counted as the number of carbon atoms of the divalent heterocyclic compound group.

Here, the heterocyclic compound means that an organic compound having a cyclic structure in which at least one heteroatom such as oxygen, sulfur, nitrogen, phosphor, boron, etc. is contained in the cyclic structure as the element other than carbon atoms.

Examples of the divalent heterocyclic compound group include: divalent heterocyclic compound groups containing nitrogen as the heteroatom, such as: pyridine-diyl groups (the below structures of Nos. 39 to 44), diazaphenylene groups (the below structures of Nos. 45 to 48), quinolinediyl groups (the below structures of Nos.49 to 63), quinoxalinediyl groups (the below structures of Nos. 64 to 68), acridinediyl groups (the below structures of Nos. 69 to 72), bipyridyldiyl groups (the below structures of Nos. 73 to 75), phenanthrolinediyl groups (the below structures of Nos. 76 to 78), etc.; groups having fluorene structure containing silicon, nitrogen, sulfur, selenium, etc. as the hetero atom (the below structures of Nos. 79 to 93); 5-membered-ring heterocyclic compound groups containing silicon, nitrogen, sulfur, selenium, etc. as the heteroatom (the below structures of Nos. 94 to 98); 5-membered-ring fused heterocyclic compound groups containing silicon, nitrogen, sulfur, selenium, etc. as the heteroatom (the below structures of Nos. 99 to 110); groups of 5-membered-ring heterocyclic compound groups containing silicon, nitrogen, sulfur, selenium, etc. as the heteroatom, which form dimer or oligomer by bonding at a-position of the hetero atom (the below structures of Nos. 111 to 112); and groups of 5-membered-ring heterocyclic compound groups containing silicon, nitrogen, sulfur, selenium, etc. as the heteroatom, which bond to a phenyl group at a-position of the hetero atom (the below structures of Nos. 113-124).

39

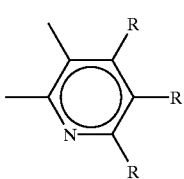

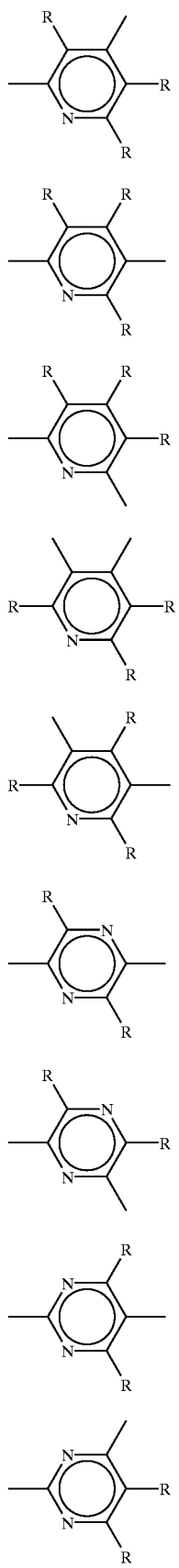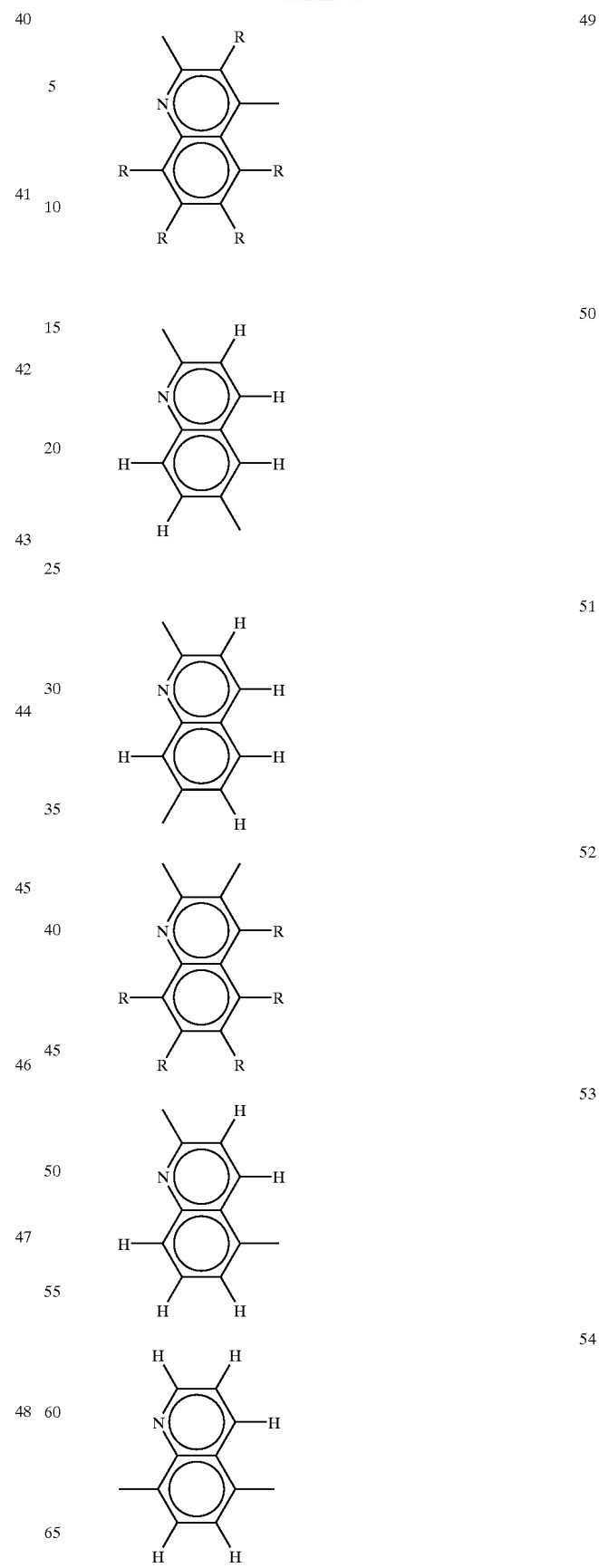

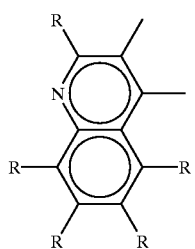
55
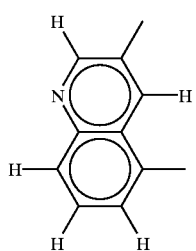
56
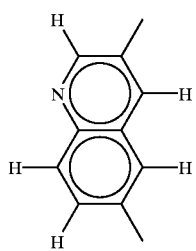
57
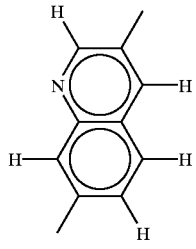
58
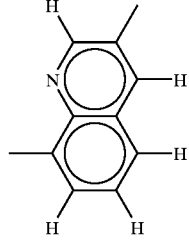
59
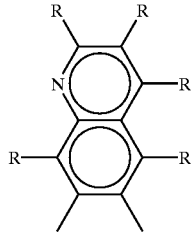
60
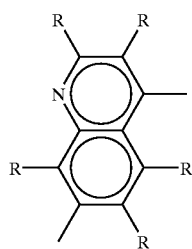
61
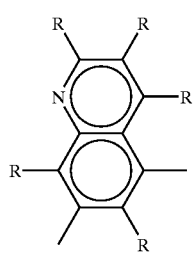
62
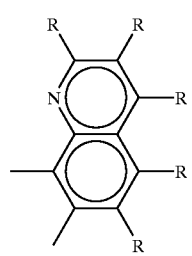
63
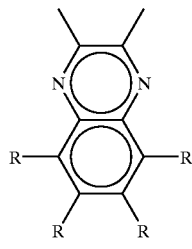
64
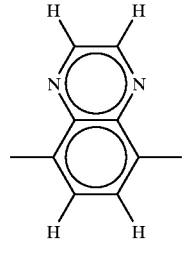
65
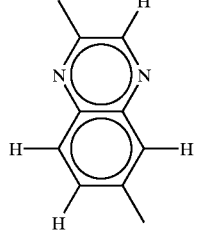
66

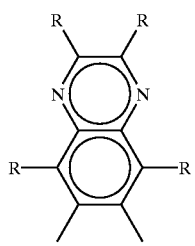 67
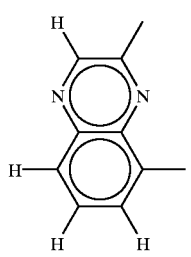 68
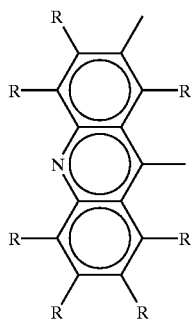 69
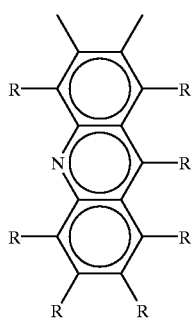 70
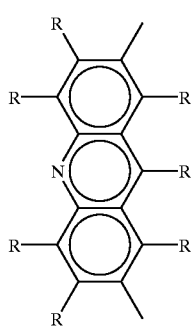 71
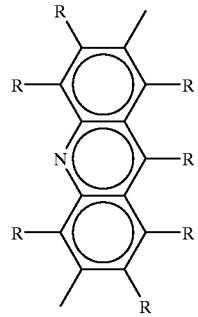 72
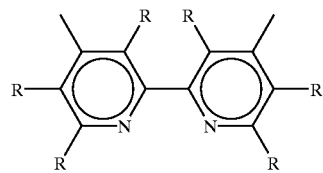 73
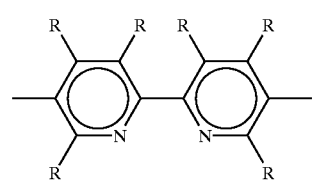 74
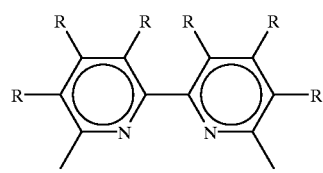 75
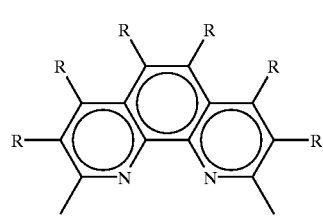 76
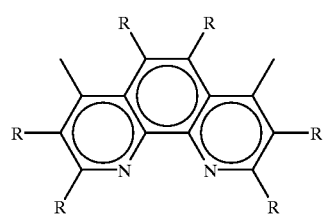 77
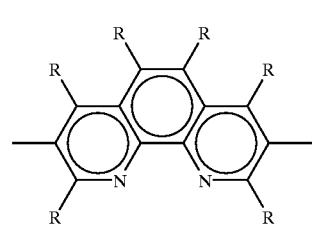 78

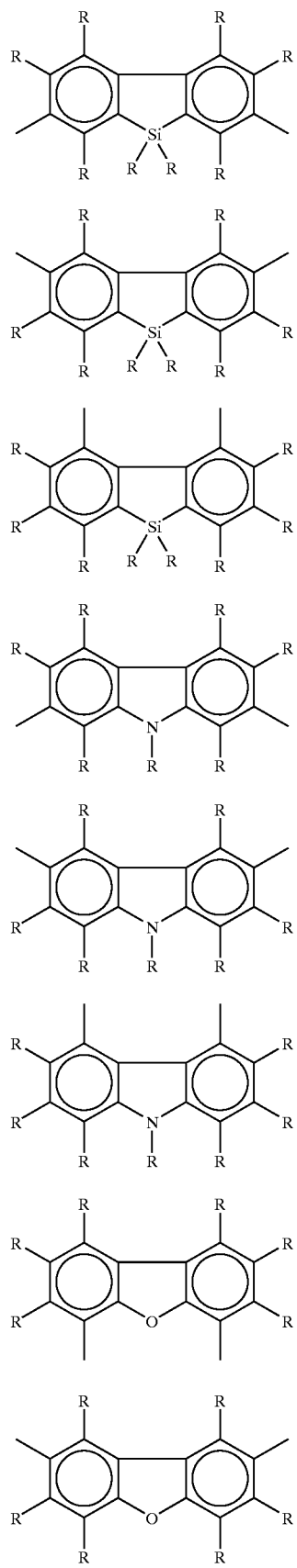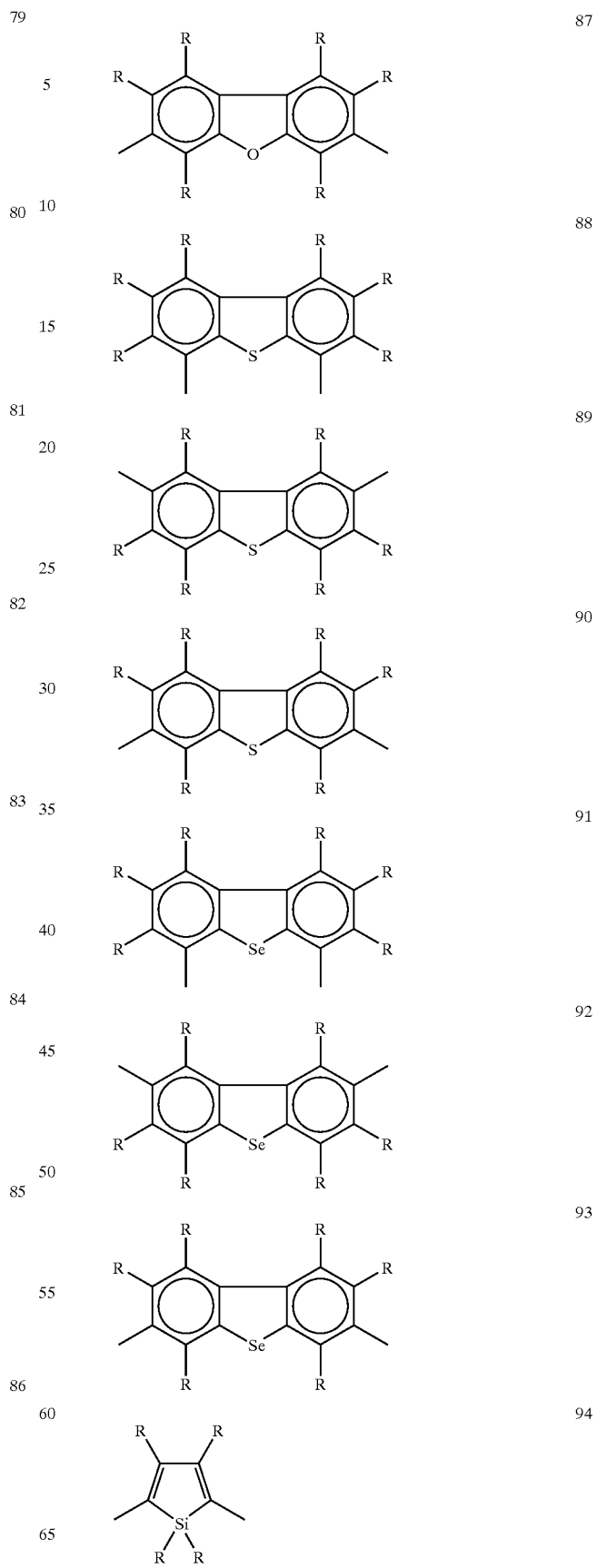

95
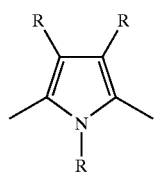
96
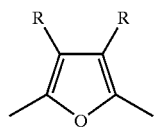
97
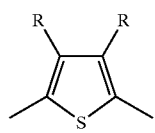
98
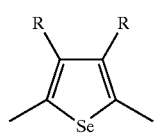
99
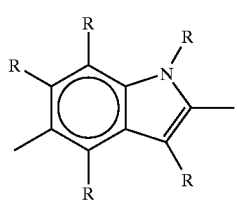
100
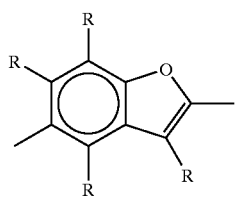
101
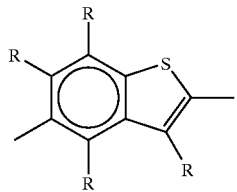
102
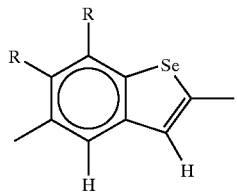
103
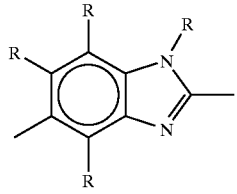
104
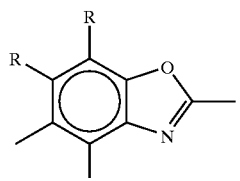
105
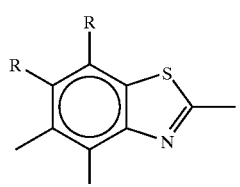
106
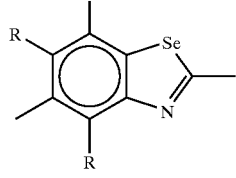
107
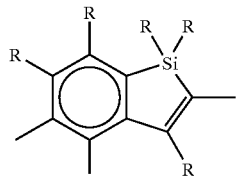
108
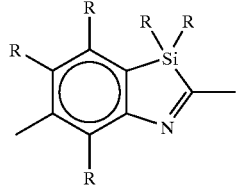
109
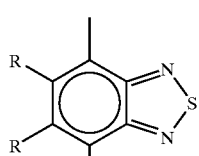
110
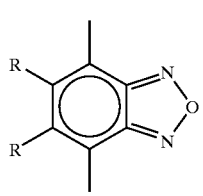
111
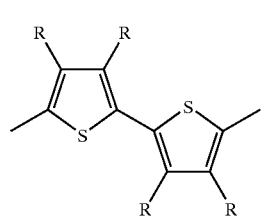

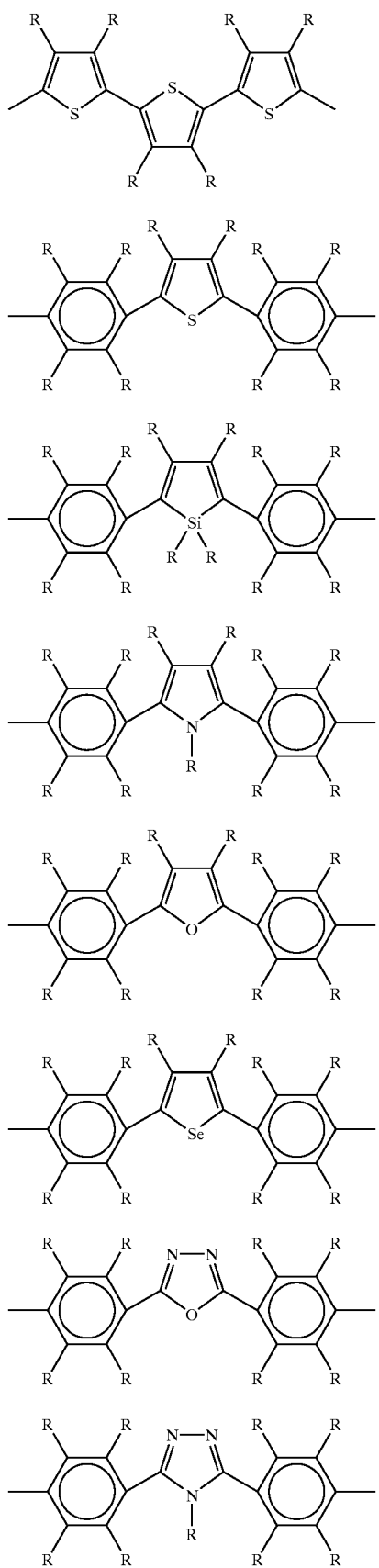

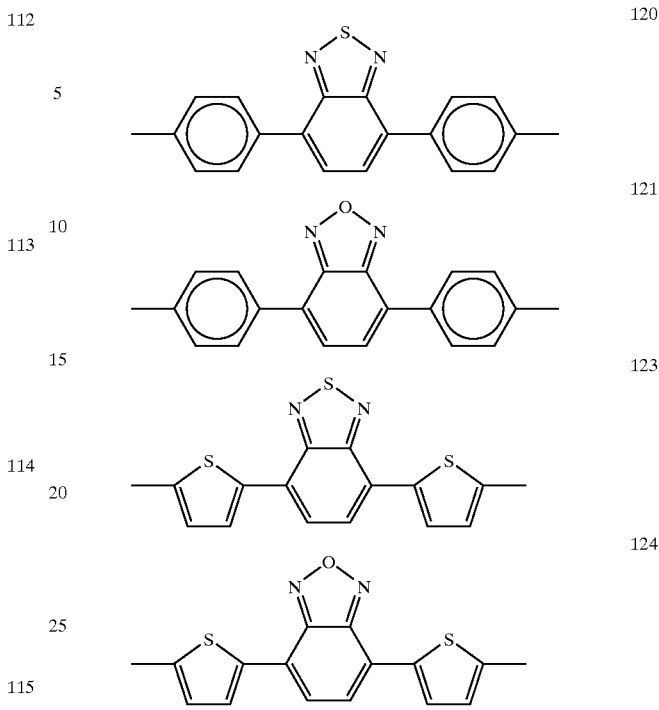

Regarding the divalent or trivalent hetero atom-bonded arylene or divalent heterocyclic compound groups as $Ar_1$, an oxygen atom and sulfur atom are exemplified as the divalent hetero atom, and a nitrogen atom and boron atom are exemplified as the trivalent hetero atom. The hetero atom may be contained alone or in combination of two or more.

As the divalent or trivalent hetero atom-bonded arylene or divalent heterocyclic compound groups, there are exemplified;

(A) divalent groups in which each one of bonding sites of two groups selected from arylene groups and divalent heterocyclic compound groups are connected via a divalent hetero atom;

(B) divalent groups in which each one of bonding sites of two groups selected from arylene groups and divalent heterocyclic compound groups are connected via a trivalent hetero atom and the remaining bonding site of this hetero atom is connected to an aryl group or monovalent heterocyclic compound group; and (C) divalent groups in which each one of bonding sites of two groups selected from the above-mentioned divalent groups (A) and the above-mentioned divalent groups (B) are connected directly.

Of the divalent or trivalent hetero atom-bonded arylene or divalent heterocyclic compound groups, those containing a phenylene group or a pyridine-diyl group are preferable.

As the above-mentioned divalent group (A), for example, groups of the following formula (3) or (4) are listed. Specifically, groups shown in the formulae below (formulae 120 and 121) are listed as aromatic ether and aromatic thioether compound groups connected by an oxygen atom and sulfur atom.

As the above-mentioned divalent group (B), for example, groups of the following formula (5) or (6) are listed. Specifically, groups shown in the formulae below (formulae 122, 124, 126) are listed. The aryl group in the divalent group (B) is an atomic group obtained by removing one hydrogen atom from an aromatic hydrocarbon, and the monovalent heterocyclic compound group is a remaining atomic group obtained by removing one hydrogen atom from a heterocyclic compound.

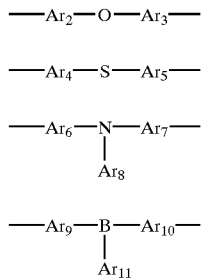

(3)
(4)
(5)
(6)

(wherein, $Ar_2$ to $Ar_7$, $Ar_9$ and $Ar_{10}$ represent an arylene group or divalent heterocyclic compound group. $Ar_8$ and $Ar_{11}$ represent an aryl group or monovalent heterocyclic compound group.)

As the divalent group (C), groups shown in the formulae below (formulae 123, 125, 127, 129 and 130) are listed.

In the divalent groups represented by the above the divalent groups (B) and (C), those are referred to as "aromatic amine" where the trivalent hetero atom is nitrogen. Among them, preferable are the divalent groups represented by the formulae 122, 123, 128 and 129 shown below.

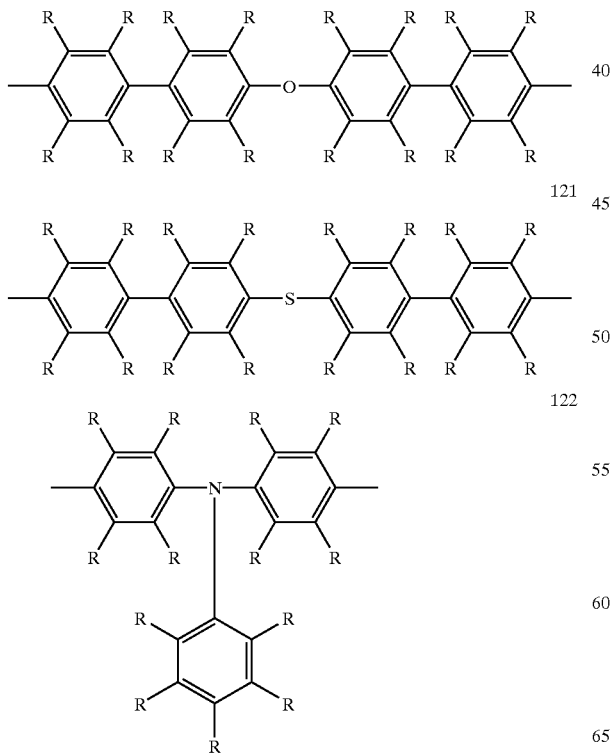

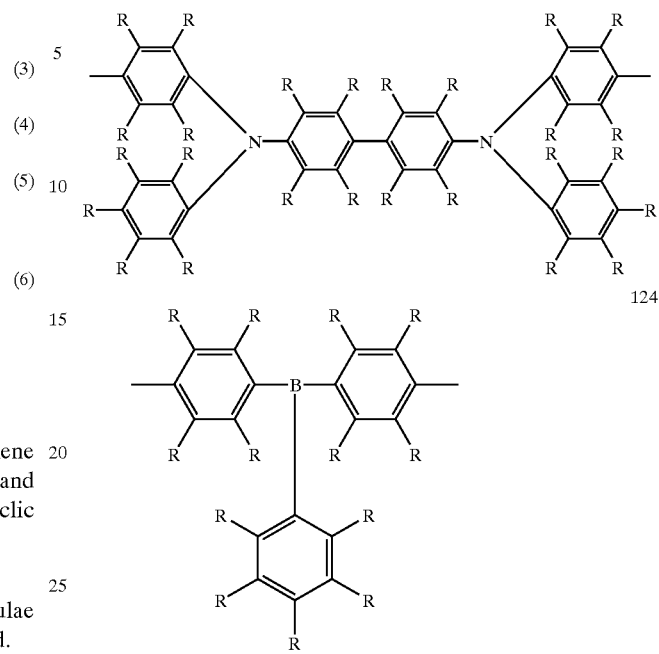

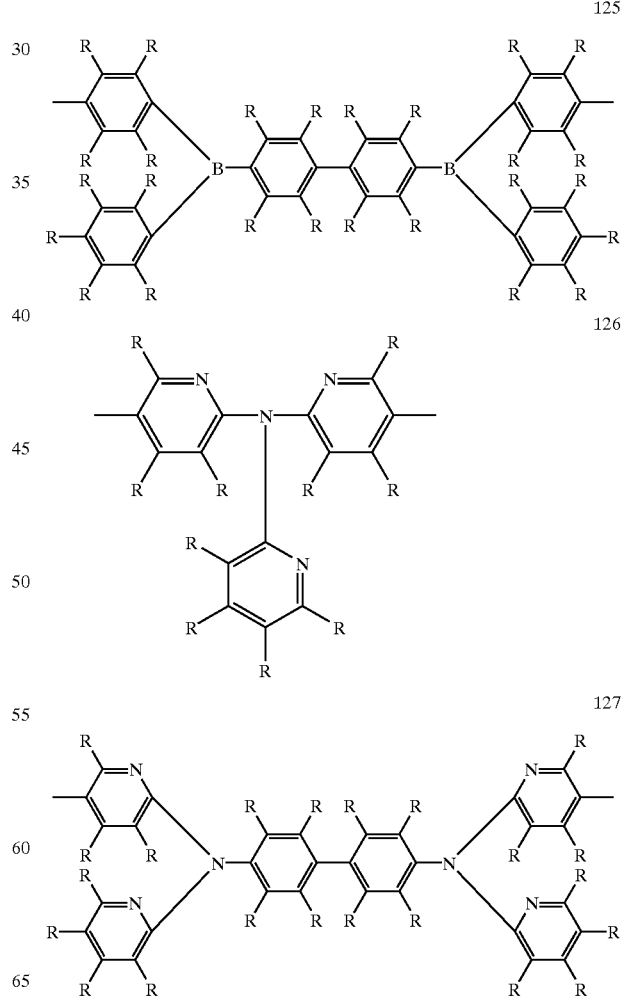

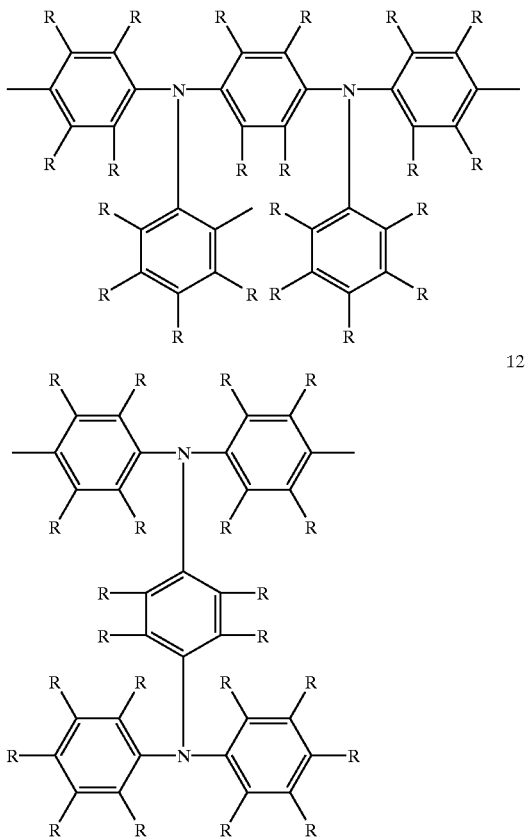

Of them, divalent groups of the formula 121, 128, and 129 shown in the above formulae are preferable.

Here, Rs represent each independently a group selected from the group consisting of a hydrogen atom, alkyl groups, alkoxy groups, alkylthio groups, alkylsilyl groups, alkylamino groups, aryl groups, aryloxy groups, arylsilyl group, arylamino groups, arylalkyl groups, arylalkoxy groups, arylalkylsilyl group, arylalkenyl groups, arylalkynyl groups, heterocyclic compound groups and cyano group. In the above-described examples, a plurality of Rs are contained in one structural formula, and they may be the same or different, and selected each independently. When $Ar_1$ has a plurality of substituents, they may be the same or different.

For solubility, it is preferable that one or more substituents are contained and it is preferable that symmetry of repeating units including substituents is low.

The alkyl group may be linear, branching or cyclic, and has usually about one to 20 carbon atoms. Examples thereof include specifically methyl group, ethyl group, propyl group, i-propyl group, butyl group, 1-butyl group, t-butyl group, pentyl group, hexyl group, cyclohexyl group, heptyl group, octyl group, 2-ethylhexyl group, nonyl group, decyl group, 3,7-dimethyloctyl group, lauryl group, etc. Among them, pentyl group, hexyl group, octyl group, 2-ethylhexyl group, decyl group, and 3,7-dimethyl octyl group are preferable.

The alkoxy group may be linear, branching or cyclic, and has usually about one to 20 carbon atoms. Examples thereof include specifically methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group etc. Among them, pentyloxy group, hexyloxy group, octyloxy group, 2-ethylhexyloxy group, decyloxy group, and 3,7-dimethyl octyloxy group are preferable.

The alkylthio group may be linear, branching or cyclic, and has usually about one to 20 carbon atoms. Examples thereof include specifically methylthio group, ethylthio group, propylthio group, and i-propylthio group, butylthio group, i-butylthio group, t-butylthio group, pentylthio group, hexylthio group, cyclo hexylthio group, heptylthio group, octylthio group, 2-ethylhexylthio group, nonylthio group, decylthio group, 3,7-dimethyloctylthio group, laurylthio group etc. Among them, pentylthio group, hexylthio group, octylthio group, 2-ethylhexylthio group, decylthio group, and 3,7-dimethyloctylthio group are preferable.

The alkylsilyl group may be linear, branching or cyclic, and has usually about one to 60 carbon atoms. Examples thereof include specifically methylsilyl group, ethylsilyl group, propylsilyl group, and i-propylsilyl group, butylsilyl group, i-butylsilyl group, t-butylsilyl group, pentylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethylsilyl group, ethyldimethylsilyl group, propyldimethylsilyl group, i-propyldimethylsilyl group, butyldimethylsilyl group, t-butyldimethylsilyl group, pentyldimethylsilyl group, hexyldimethylsilyl group, heptyldimethylsilyl group, octyldimethylsilyl group, 2-ethylhexyldimethylsilyl group, nonyldimethylsilyl group, decyldimethylsilyl group, 3,7-dimethyloctyl-dimethylsilyl group, lauryldimethylsilyl group, etc. Among them, pentylsilyl group, hexylsilyl group, octylsilyl group, 2-ethylhexylsilyl group, decylsilyl group, 3,7-dimethyloctylsilyl group, pentyldimethylsilyl group, hexyldimethylsilyl group, octyldimethylsilyl group, 2-ethylhexyl-dimethylsilyl group, decyldimethylsilyl group, 3,7-dimethyloctyl-dimethylsilyl group are preferable.

The alkylamino group may be linear, branching or cyclic, and has usually about one to 40carbon atoms. Either monoalkylamino group or dialkylamino group may be available.

Examples thereof include specifically methylamino group, dimethylamino group, ethylamino group, diethylamino group, propylamino group, i-propylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, etc. Among them, pentylamino group, hexylamino group, octylamino group, 2-ethylhexylamino group, decylamino group, and 3,7-dimethyloctylamino group are preferable.

The aryl group has usually about 6 to 60 carbon atoms. Examples thereof include phenyl group, $C_{1-12}$ alkoxyphenyl group ($C_{1-12}$ means that the number of carbon atoms is from 1 to 12), $C_{1-12}$ alkylphenyl group, 1-naphtyl group, 2-naphtyl group, etc. Among them, $C_{1-12}$ alkoxyphenyl group, and $C_{1-12}$ alkylphenyl group are preferable.

The aryloxy group has usually about 6 to 60 carbon atoms. Examples thereof include specifically, phenoxy group, $C_{1-12}$ alkoxyphenoxy group, $C_{1-12}$ alkylphenoxy group, 1-naphtyloxy group, 2-naphtyloxy group, etc. Among them, $C_{1-12}$ alkoxyphenoxy group, and $C_{1-12}$ alkylphenoxy group are preferable.

The arylsilyl group has usually about 6 to 60 carbon atoms Examples thereof include specifically, phenylsilyl group, $C_{1-12}$ alkoxyphenylsilyl group, $C_{1-12}$ alkylphenylsilyl group, 1-naphtylsilyl group, 2-naphtylsilyl group, dimethylphenylsilyl group, etc. Among them, $C_{1-12}$ alkoxyphenylsilyl group and $C_{1-12}$ alkylphenylsilyl group are preferable.

The arylamino group has usually about 6 to 60 carbon atoms. Examples thereof include specifically, diphenylamino group, $C_{1-12}$ alkoxyphenylamino group, di ($C_{1-12}$ alkoxyphenyl) amino group, di($C_{1-12}$ alkylphenyl)amino group, 1-naphtylamino group, 2-naphtylamino group, etc. Among them $C_{1-12}$alkylphenylamino group, and di($C_{1-12}$ alkylphenyl)amino group are preferable.

The arylalkyl group has usually about 7 to 60 carbon atoms. Examples thereof include specifically, phenyl-$C_{1-12}$ alkyl group, $C_{1-12}$alkoxyphenyl-$C_{1-12}$alkyl group, $C_{1-12}$ alkylphenyl-$C_{1-12}$alkyl group, 1-naphtyl-$C_{1-12}$alkyl group, 2-naphtyl-$C_{1-12}$ alkyl group, etc. Among them, $C_{1-12}$alkoxyphenyl-$C_{1-12}$alkyl group, and $C_{1-12}$alkylphenyl-$C_{1-12}$alkyl group are preferable.

The arylalkoxy group has usually about 7 to 60 carbon atoms. Examples thereof include specifically, phenyl-$C_{1-12}$ alkoxy group, $C_{1-12}$alkoxyphenyl-$C_{1-12}$alkoxy group, $C_{1-12}$alkylphenyl-$C_{1-12}$alkoxy group, 1-naphtyl-$C_{1-12}$alkoxy group, 2-naphtyl-$C_{1-12}$alkoxy group, etc. Among them, $C_{1-12}$alkoxyphenyl-$C_{1-12}$alkoxy group, and $C_{1-12}$alkylphenyl-$C_{1-12}$alkoxy group are preferable.

The arylalkylsilyl group has usually about 7 to 60 carbon atoms. Examples thereof include specifically, phenyl-$C_{1-12}$ alkylsilyl group, $C_{1-12}$alkoxyphenyl-$C_{1-12}$alkylsilyl group, $C_{1-12}$alkylphenyl-$C_{1-12}$alkylsilyl group, 1-naphtyl-$C_{1-12}$alkylsilyl group, 2-naphtyl-$C_{1-12}$alkylsilyl group, phenyl-$C_{1-12}$alkyldimethylsilyl group, etc. Among them, $C_{1-12}$alkoxyphenyl-$C_{1-12}$alkylsilyl group, and $C_{1-12}$ alkylphenyl-$C_{1-12}$alkylsilyl group are preferable.

The arylalkylamino group has usually about 7 to 60 carbon atoms. Examples thereof include specifically, phenyl-$C_{1-12}$alkylamino group, $C_{1-12}$alkoxyphenyl-$C_{1-12}$ alkylamino group, $C_{1-12}$alkylphenyl-$C_{1-12}$alkylamino group, di($C_{1-12}$ alkoxyphenyl-$C_{1-12}$alkyl)amino group, di($C_{1-12}$ alkylphenyl-$C_{1-12}$alkyl)amino group, 1-naphtyl-$C_{1-12}$ alkylamino group, 2-naphtyl-$C_{1-12}$alkylamino group, etc. Among them, $C_{1-12}$ alkylphenyl-$C_{1-12}$alkylamino group, and di ($C_{1-12}$ alkylphenyl-$C_{1-12}$alkyl) amino group are preferable.

The arylalkenyl group has usually about 7 to 60 carbon atoms. Examples thereof include specifically, phenyl-$C_{1-12}$ alkenyl group, $C_{1-12}$alkoxyphenyl-$C_{1-12}$alkenyl group, $C_{1-12}$ alkylphenyl-$C_{1-12}$alkenyl group, 1-naphtyl-$C_{1-12}$ alkenyl group, 2-naphtyl-$C_{1-12}$alkenyl group, etc. Among them, $C_{1-12}$ alkoxyphenyl-$C_{1-12}$alkenyl group, and $C_{1-12}$ alkylphenyl-$C_{1-12}$ alkenyl group are preferable.

The arylalkynyl group has usually about 7 to 60 carbon atoms. Examples thereof include specifically, phenyl-$C_{1-12}$alkynyl group, $C_{1-12}$alkoxyphenyl-$C_{1-12}$alkynyl group, $C_{1-12}$ alkylphenyl-$C_{1-12}$alkynyl group, 1-naphtyl-$C_{1-12}$ alkynyl group, 2-naphtyl-$C_{1-12}$ alkynyl group, etc. Among them, $C_{1-12}$ alkoxyphenyl-$C_{1-12}$alkynyl group, and $C_{1-12}$ alkylphenyl-$C_{1-12}$ alkynyl group are preferable.

The monovalent heterocyclic compound group means an atomic group of a heterocyclic compound in which one hydrogen atom is removed, and has usually about 3 to 60 carbon atoms. Examples thereof include thienyl group, $C_{1-12}$alkylthienyl group, pyroryl group, furyl group, pyridyl group, $C_{1-12}$alkylpyridyl group, etc. Among them, thienyl group, $C_{1-12}$ alkylthienyl group, pyridyl group, and $C_{1-12}$alkylpyridyl group are preferable.

Of examples of R, substituents containing an alkyl chain may be linear, branched or cyclic or combination thereof, and in the case of not linear, there are exemplified an isoamyl group, 2-ethylhexylgroup, 3,7-dimethyloctylgroup, cyclohexyl group, 4-$C_1$ to $C_{12}$ alkylcyclohexyl group and the like. For good solubility of a polymeric fluorescent substance into a solvent, it is preferable that one or more substituents on $Ar_1$ contain a cyclic or branched alkyl chain.

Also, a plurality of Rs may be connected to form a ring. Further, when R is a group containing an alkyl chain, this alkyl chain may be interrupted by a group containing a hetero atom. Here, as this hetero atom, an oxygen atom, sulfur atom, nitrogen atom and the like are exemplified. As the group containing a hetero atom, the following groups are exemplified.

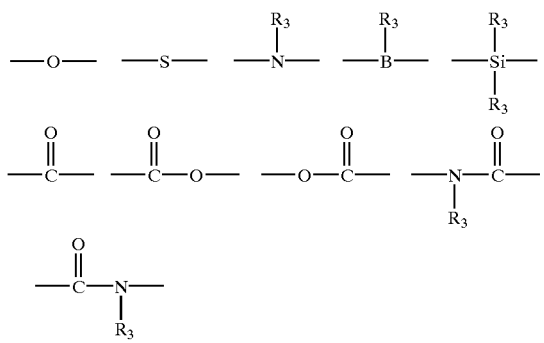

Herein, examples of $R_3$ include a hydrogen atom, alkyl groups having 1 to 20 carbon atoms, aryl groups having 6 to 60 carbon atoms and monovalent heterocyclic compound groups having 3 to 60 carbon atoms.

Further, among examples of R, when an aryl group and heterocyclic compound group are contained partially, they may have further one or more substituents.

When one monomer of the formula (1) is used, a homopolymer is obtained, and two monomers are used, a copolymer is usually obtained.

For example, when two different monomers of the above formula (1) are represented, by $X_1$-A-$X_2$ and $X_1$—B—$X_2$, respectively, the copolymer represented by the above formula (2) obtained by polymerizing these monomers with using the method of the present invention, has inevitably contains the partial structures represented by -A-B—, —B-A-, -A-A- and —B—B—.

The end group of a polymeric fluorescent substance may be protected by a stable group, since when a polymerization active group remains, there is a possibility of reduction in light-emitting property and lifetime when made into a device. Those having a conjugation bond continued to a conjugated structure of the main chain are preferable, and example, structures containing a connection to an aryl group or heterocyclic compound group via a vinylene group may also be permissible. Specifically, substituents shown in Chemical Formula 10 in JP-A No. 9-45478, and the like are exemplified.

The above-mentioned polymeric fluorescent substance may contain repeating units other than repeating units of the formula (2), in amount causing no deterioration of fluorescent property and electron charge transporting property. Further, repeating units of the formula (2) and other repeating units may be connected by vinylene or non-conjugated portion, or repeating units may contain vinylene or non-conjugated portion. As the above-mentioned connected structure containing a non-conjugated portion, exemplified are structures shown below, those containing a combination of structures shown below with a vinylene group, and those containing a combination of two or more structures shown below. Here, R represents a group selected from the same substituents as described above, and Ar represents a hydrocarbon group having 6 to 60 carbon atoms.

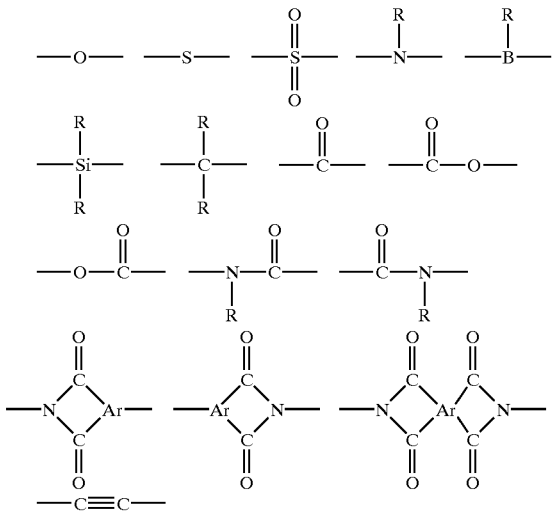

The polymeric fluorescent substance may also be a random, block or graft copolymer, or a polymer having an intermediate structure thereof, for example, a random copolymer having blocking property. From the viewpoint for obtaining a polymeric fluorescent substance having high fluorescent quantum yield, random copolymers having blocking property and block or graft copolymers are more preferable than complete random copolymers. Further, copolymers may have branched main chain and three or more terminals. Dendrimers are also included.

Further, as the polymeric fluorescent substance, those emitting fluorescence in a solid state are suitably used, since the material utilizes light emission from a thin film.

As good solvents for the polymeric fluorescent substance, there are exemplified chloroform, methylene chloride, dichloroethane, tetrahydrofuran, toluene, xylene, mesitylene, tetralin, decalin, n-butylbenzene and the like. The polymeric fluorescent substance can be usually dissolved in these solvents in an amount of 0.1 wt % or more, though the amount differs depending on the structure and molecular weight of the polymeric fluorescent substance.

When these polymeric fluorescent substances are used as a light emitting material of a polymer LED, the purity thereof exerts an influence on light emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis.

Next, the polymer LED of the present invention will be illustrated. The polymer LED of the present invention is a polymer LED comprising at least a light emitting layer between a pair of electrodes composed of an anode and a cathode at least one of which is transparent or semitransparent wherein the light emitting layer contains a polymeric fluorescent substance of the present invention.

As the polymer LED of the present invention, there are listed polymer LEDs having an electron transporting layer disposed between a cathode and a light emitting layer, polymer LEDs having a hole transporting layer disposed between an anode and a light emitting layer, polymer LEDs having an electron transporting layer disposed between a cathode and a light emitting layer and having a hole transporting layer disposed between an anode and a light emitting layer.

For example, the following structures a) to d) are specifically exemplified.

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode (wherein, / indicates adjacent lamination of layers. Hereinafter, the same)

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer.

The light emitting layer, hole transporting layer and electron transporting layer may also each independently used in two or more layers.

Of charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode
j) anode/charge injecting layer/hole transporting layer/light emitting layer/charge injecting layer/cathode
k) anode/charge injecting layer/light emitting layer/electron transporting layer/cathode
l) anode/light emitting layer/electron transporting layer/charge injecting layer/cathode
m) anode/charge injecting layer/light emitting layer/electron transporting layer/charge injecting layer/cathode n) anode/charge injecting layer/hole transporting layer/light emitting layer/electron transporting layer/cathode o) anode/hole transporting layer/light emitting layer/electron transporting layer/charge injecting layer/cathode p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode In producing a polymer LED, when a film is formed from a solution by using such polymeric fluorescent substance soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 $\mu$m, preferably from 2 nm to 500 nm, further preferably from 5 nm to 200 nm.

In the polymer LED of the present invention, a light emitting material other than the above-mentioned polymeric fluorescent substances may be mixed in a light emitting layer. Further, in the polymer LED according to the instant application, a light emitting layer containing a light emitting material other than the above-mentioned polymeric fluorescent substance may be laminated with a light emitting layer containing the above-mentioned polymeric fluorescent substance.

As the light emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361,2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transportingmaterial having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methylmethacrylate), polystyrene, poly (vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 $\mu$m, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361,2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively. When film-forming is conducted from a solution or melted state, a polymer binder may be used together.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylenevinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 μm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium.tin.oxide (ITO), indium.zinc.oxide and the like, which are metal oxide complexes, and gold, platinum, silver, copper and the like are used, and among them, ITO, indium.zinc.oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 μm, preferably from 20 nm to 1 μm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The film thickness of a cathode can be appropriately selected in view of electric conductivity and durability, and for example, it is from 10 nm to 10 μm, preferably from 20 nm to 1 μm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

EXAMPLES

The following examples illustrate the present invention further in detail but do not limit the scope of the invention.

Here, the polystyrene reduced weight-average molecular weight and polystyrene reduced number-average molecular weight were measured by gel permeation chromatography (GPC) using chloroform as a solvent.

Example 1
<Synthesis of Polymeric Fluorescent Substance 1>

0.82 g (1.5 mmol) of 9,9-dioctyl-2,7-dibromofluorene and 0.55 g (3.5 mmol) of 2,2'-bipyridyl were charged into a reaction vessel, then, an atmosphere in the reaction system was purged with an argon gas. To this was added 40 ml of tetrahydrofuran (dehydrated) aerated by bubbling with an argon gas. Then, to this mixed solution was added 0.96 g (3.5 mmol) of bis(1,5-cyclooctadiene)nickel (0), and the mixture was stirred for 10 minutes at room temperature, then, the mixture was reacted at 60° C. for 8 hours. This reaction was carried out in an argon gas atmosphere. After the reaction, this solution was cooled, then, poured into a mixed solution of 10 ml of 25% ammonia water, 200 ml of methanol and 50 ml of ion exchanged water, and the mixture was stirred for about one hour. Then, the produced precipitation was filtrated and recovered. This precipitation was dried, then, dissolved in chloroform. This solution was filtrated to remove undissolved materials, then, this solution was poured into methanol to cause re-precipitation, and the produced precipitation was recovered. This precipitation was dried under reduced pressure to obtain 0.35 g of a polymer.

This polymer had a polystyrene reduced weight-average molecular weight of $5.4 \times 10^5$, and a polystyrene reduced number-average molecular weight of $1.7 \times 10^5$.

Example 2
<Synthesis of Polymeric Fluorescent Substance 2>

A polymer was obtained by the same manner as in Example 1 except that 0.89 g (1.7 mmol) of 9,9-dioctyl-2,7-dibromofluorene was used.

This polymer had a polystyrene reduced weight-average molecular weight of $1.1 \times 10^5$, and a polystyrene reduced number-average molecular weight of $4.2 \times 10^4$.

Example 3
<Synthesis of Polymeric Fluorescent Substance 3>

A polymer was obtained by the same manner as in Example 1 except that 1.05 g (1.9 mmol) of 9,9-dioctyl-2,7-dibromofluorene was used.

This polymer had a polystyrene reduced weight-average molecular weight of $8.4 \times 10^4$, and a polystyrene reduced number-average molecular weight of $3.1 \times 10^4$.

Example 4
<Synthesis of Polymeric Fluorescent Substance 4>

A polymer was obtained by the same manner as in Example 1 except that 20 ml of tetrahydrofuran (dehydrated solvent) was used.

This polymer had a polystyrene reduced weight-average molecular weight of $3.9 \times 10^5$, and a polystyrene reduced number-average molecular weight of $1.5 \times 10^5$.

Comparative Example 1
<Synthesis of Polymeric Fluorescent Substance 5>

A polymer was obtained by the same manner as in Example 1 except that 1.2 g (2.2 mmol) of 9,9-dioctyl-2,7-dibromofluorene was used.

This polymer had a polystyrene reduced weight-average molecular weight of $5.4 \times 10^4$, and a polystyrene reduced number-average molecular weight of $2.0 \times 10^4$.

Comparative Example 2
<Synthesis of Polymeric Fluorescent Substance 6>

A polymer was obtained by the same manner as in Example 1 except that 1.6 g (3.0 mmol) of 9,9-dioctyl-2,7-dibromofluorene and 60 ml of tetrahydrofuran were used.

This polymer had a polystyrene reduced weight-average molecular weight of $1.1 \times 10^4$, and a polystyrene reduced number-average molecular weight of $7.7 \times 10^3$.

Comparative Example 3
<Synthesis of Polymeric Fluorescent Substance 7>

A polymer was obtained by the same manner as in Example 4 except that N,N-dimethylformamide (dehydrated) was used instead of tetrahydrofuran (dehydrated).

This polymer had a polystyrene reduced weight-average molecular weight of $1.4 \times 10^4$, and a polystyrene reduced number-average molecular weight of $6.8 \times 10^3$, which were lower than the molecular weights of the polymer obtained in Example 1.

Example 5
<Synthesis of Polymeric Fluorescent Substance 8>

A polymer was obtained by the same manner as in Example 1 except that 1,4-dioxane (dehydrated) was used instead of tetrahydrofuran (dehydrated).

This polymer had a polystyrene reduced weight-average molecular weight of $3.6 \times 10^5$, and a polystyrene reduced number-average molecular weight of $1.0 \times 10^5$.

Comparative Example 4
<Synthesis of Polymeric Fluorescent Substance 9>

A polymer was obtained by the same manner as in Example 5 except that 0.28 g (1.8 mmol) of 2,2'-bipyridyl and 0.48 g (1.8 mmol) of bis(1,5-cyclooctadiene)nickel (0) were used. This polymer had a polystyrene reduced weight-average molecular weight of $1.4 \times 10^4$, and a polystyrene reduced number-average molecular weight of $8.1 \times 10^3$.

Example 6
<Synthesis of Polymeric Fluorescent Substance 10>

0.82 g (1.5 mmol) of 9,9-dioctyl-2,7-dibromofluorene and 0.55 g (3.5 mmol) of 2,2'-bipyridyl were charged into a reaction vessel, then, an atmosphere in the reaction system was purged with an argon gas. To this was added 40 ml of toluene degassed by bubbling with an argon gas (dehydrated solvent). Then, to this mixed solution was added 0.96 g (3.5 mmol) of bis(1,5-cyclooctadiene)nickel (0), and the mixture was stirred for 10 minutes at room temperature, then, the mixture was reacted at 60° C. for 8 hours. This reaction was conducted in an argon gas atmosphere. After the reaction, this solution was cooled, then, poured into a mixed solution of 10 ml of 25% ammonia water, 150 ml of methanol and 50 ml of ion exchanged water, and the mixture was stirred for about one hour. Then, this mixed solution was allowed to stand still, to cause separation into two layers. The upper layer was recovered, and this solution was poured into methanol to cause re-precipitation, and the produced precipitation was recovered. This precipitation was dried, then, dissolved into chloroform. This solution was filtrated to remove undissolved materials, then, this solution was poured into methanol to cause re-precipitation, and the produced precipitation was recovered. This precipitation was dried under reduced pressure to obtain 0.14 g of a polymer.

This polymer had a polystyrene reduced weight-average molecular weight of $3.6 \times 10^5$, and a polystyrene reduced number-average molecular weight of $1.0 \times 10^5$.

Example 7

<Synthesis of polymeric fluorescent substance 1>

A polymer was obtained by the same manner as in Example 6 except that 0.89 g (1.7 mmol) of 9,9-dioctyl-2,7-dibromofluorene was used.

This polymer had a polystyrene reduced weight-average molecular weight of $2.9 \times 10^5$, and a polystyrene reduced number-average molecular weight of $7.0 \times 10^4$.

The results of Examples 1 to 7 and Comparative Examples 1 to 4 are summarized in Table 1.

TABLE 1

Results of polymerization of 9,9'-dioctyl-2,7-dibromofluorene

| | Solvent | $Ni(COD)_2$/monomer (mol/mol) | Polystyrene reduced weight-average molecular weight |
|---|---|---|---|
| Example 1 | Tetrahydrofuran | 2.3 | $5.4 \times 10^5$ |
| Example 2 | Tetrahydrofuran | 2.1 | $1.1 \times 10^5$ |
| Example 3 | Tetrahydrofuran | 1.8 | $8.4 \times 10^4$ |
| Example 4 | Tetrahydrofuran | 2.3 | $3.9 \times 10^5$ |
| Comparative example 1 | Tetrahydrofuran | 1.6 | $5.4 \times 10^4$ |
| Comparative example 2 | Tetrahydrofuran | 1.2 | $1.1 \times 10^4$ |
| Comparative example 3 | N,N-dimethylformamide | 2.3 | $1.4 \times 10^4$ |
| Example 5 | Dioxane | 2.3 | $3.6 \times 10^5$ |
| Comparative example 4 | Dioxane | 1.2 | $1.4 \times 10^4$ |
| Example 6 | Toluene | 2.3 | $3.6 \times 10^5$ |
| Comparative example 7 | Toluene | 2.1 | $2.9 \times 10^5$ |

$Ni(COD)_2$: bis(1,5-cyclooctadiene)nickel (0)
Monomer: 9,9'-dioctyl-2,7-dibromofluorene Example 8

<Fluorescent Property>

A 0.4 wt % solution of a polymeric fluorescent substance 1 in chloroform was spin-coated on a quarts plate to form a thin film of the polymeric fluorescent substance 1. The ultraviolet visible absorption spectrum and the fluorescent spectrum of this fin film were measured by using an ultraviolet visible absorption spectrophotometer (UV3500 manufactured by Hitachi Ltd.) and a fluorescent spectrophotometer (850 manufactured by Hitachi Ltd.), respectively. For calculation of fluorescent intensity, fluorescent spectrum when excited at 350 nm was used. The relative value of fluorescent intensity was calculated by dividing the area of fluorescent spectrum plotted against wave number on the abscissa by absorption at 350 nm.

The polymeric fluorescent substance 1 had a fluorescent peak wavelength of 428 nm and a relative value of fluorescent intensity of 4.0. A polymeric fluorescent substance 7 obtained by the same manner had a relative value of fluorescent intensity of 1.2 which was lower than that of the polymeric fluorescent substance 1.

Example 9

<Manufacturing and Evaluation of Device>

On a glass substrate carrying an ITO film having a thickness of 150 nm provided by a sputtering method, a solution of poly(ethylenedioxythiophene)/polystyrenesulfonic acid (Baytron manufactured by Bayer) was spin-coated to form a film having a thickness of 50 nm which was dried at 120° C. for 5 minutes on a hot plate. Then, a 0.4 wt % solution of a polymeric fluorescent substance 1 in chloroform was spin-coated to form a film having a thickness of 100 nm. Further, this was dried under reduced pressure at 80° C. for 1 hour, then, 0.4 nm of lithium fluoride was vapor-deposited as a cathode buffer layer and 25 nm of calcium, then, 40 nm of aluminum were vapor-deposited as a cathode, to manufacture a polymer LED. Degrees of vacuum in vapor deposition were all from 1 to $8 \times 10^{-6}$ Torr. By applying voltage on the resulted device, EL light emission from the polymeric fluorescent substance 1 was obtained.

Example 10

<Synthesis of Polymeric Fluorescent Substance 12>

0.411 g of 9,9-dioctyl-2,7-dibromofluorene, 0.506 g of N,N'-diphenyl-N,N'-di(3-methyl-4-bromophenyl)benzidine and 0.55 g of 2,2'-bipyridyl were charged into a reaction vessel, then, an atmosphere in the reaction system was purged with an argon gas. To this was added 35 ml of tetrahydrofuran degassed by bubbling with an argon gas (dehydrated). Then, to this mixed solution was added 0.96 g of bis(1,5-cyclooctadiene)nickel (0), and the mixture was stirred for 10 minutes at room temperature, then, the mixture was reacted at 60° C. for 8 hours. This reaction was conducted in an argon gas atmosphere. After the reaction, this solution was cooled, then, poured into a mixed solution of 10 ml of 25% ammonia water, 200 ml of methanol and 50 ml of ion exchanged water, and the mixture was stirred for about one hour. Then, the produced precipitation was filtrated and recovered. This precipitation was dried, then, dissolved in chloroform. This solution was filtrated to remove undissolved materials, then, this solution was poured into methanol to cause re-precipitation, and the produced precipitation was recovered. This precipitation was dried under reduced pressure to obtain 0.2 g of a polymer.

This polymer had a polystyrene reduced weight-average molecular weight of $7.8 \times 10^5$, and a polystyrene reduced number-average molecular weight of $4.1 \times 10^4$.

The structure and the molar ratio of repeating units of the polymeric fluorescent substance 12 expected from the charged monomers are as shown below.

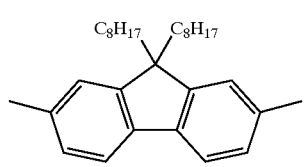

A

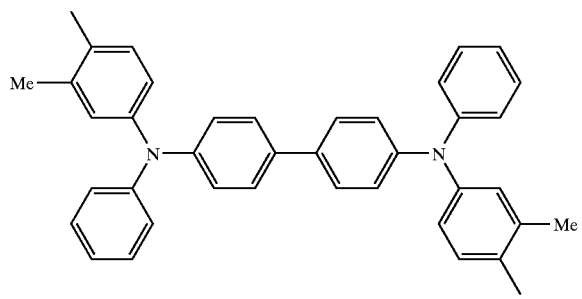

A:B = 1:1

Example 11

<Synthesis of Polymeric Fluorescent Substance 13>

0.51 g of 9,9-dioctyl-2,7-dibromofluorene, 0.304 g of N,N'-diphenyl-N,N'-di(3-methyl-4-bromophenyl)benzidine, 0.078 g of 3,3'-di(3,7-dimethyloctyloxy)-4,4'-dibromostylbene and 0.55 g of 2,2'-bipyridyl were charged into a reaction vessel, then, an atmosphere in the reaction system was purged with an argon gas. To this was added 40 ml of tetrahydrofuran degassed by bubbling with an argon gas (dehydrated). Then, to this mixed solution was added 0.96 g of bis(1,5-cyclooctadiene)nickel (0), and the mixture was stirred for 10 minutes at room temperature, then, the mixture was reacted at 60° C. for 8 hours. This reaction was conducted in an argon gas atmosphere. After the reaction, this solution was cooled, then, poured into a mixed solution of 10 ml of 25% ammonia water, 200 ml of ethanol and 50 ml of ion exchanged water, and the mixture was stirred for about one hour. Then, the produced precipitation was filtrated and recovered. This precipitation was dried, then, dissolved in chloroform. This solution was filtrated to remove undissolved materials, then, this solution was poured into methanol to cause re-precipitation, and the produced precipitation was recovered. This precipitation was dried under reduced pressure to obtain 0.31 g of a polymer.

This polymer had a polystyrene reduced weight-average molecular weight of $1.9 \times 10^5$, and a polystyrene reduced number-average molecular weight of $3.5 \times 10^4$.

The structure and the molar ratio of repeating units of the polymeric fluorescent substance 13 expected from the charged monomers are as shown below.

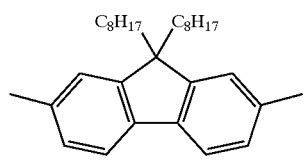

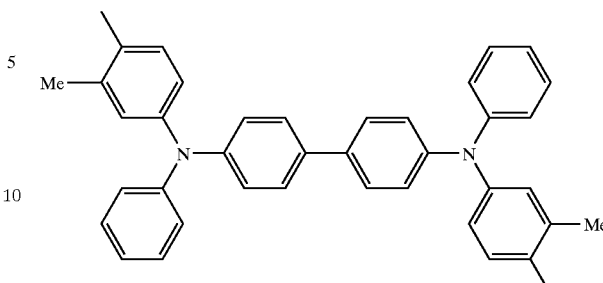

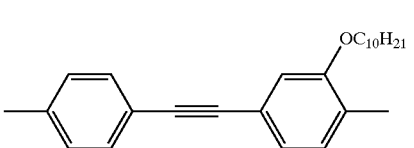

A:B:C = 63:30:8

Example 12

<Synthesis of Polymeric Fluorescent Substance 14>

0.441 g of 9,9-dioctyl-2,7-dibromofluorene, 0.411 g of 1,4-dibromo-2,5-di(3,7-dimethyloctyloxy)benzene and 0.55 g of 2,2'-bipyridyl were charged into a reaction vessel, then, an atmosphere in the reaction system was purged with an argon gas. To this was added 35 ml of tetrahydrofuran degassed by bubbling with an argon gas (dehydrated). Then, to this mixed solution was added 0.96 g of bis(1,5-cyclooctadiene)nickel (0), and the mixture was stirred for 10 minutes at room temperature, then, the mixture was reacted at 60° C. for 8 hours. This reaction was conducted in an argon gas atmosphere. After the reaction, this solution was cooled, then, poured into a mixed solution of 10 ml of 25% ammonia water, 200 ml of methanol and 50 ml of ion exchanged water, and the mixture was stirred for about one hour. Then, the produced precipitation was filtrated and recovered. This precipitation was dried, then, dissolved in chloroform. This solution was filtrated to remove undissolved materials, then, this solution was poured into methanol to cause re-precipitation, and the produced precipitation was recovered. This precipitation was dried under reduced pressure to obtain 0.2 g of a polymer.

This polymer had a polystyrene reduced weight-average molecular weight of $2.1 \times 10^5$, and a polystyrene reduced number-average molecular weight of $5.8 \times 10^4$.

The structure and the molar ratio of repeating units of the polymeric fluorescent substance 14 expected from the charged monomers are as shown below.

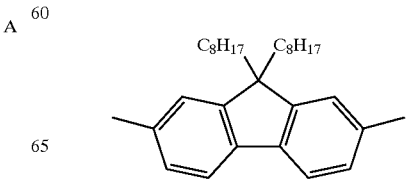

-continued

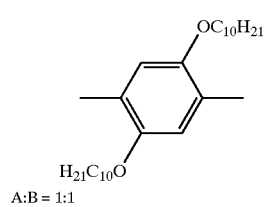

B

A:B = 1:1

Example 13
<Synthesis of Polymeric Fluorescent Substance 15>

0.441 g of 9,9-dioctyl-2,7-dibromofluorene, 0.30 g of 1,4-dibromo-2-methoxy-5-octyloxybenzene and 0.55 g of 2,2'-bipyridyl were charged into a reaction vessel, then, an atmosphere in the reaction system was purged with an argon gas. To this was added 40 ml of tetrahydrofuran degassed by bubbling with an argon gas (dehydrated). Then, to this mixed solution was added 0.96 g of bis (1,5-cyclooctadiene) nickel (0), and the mixture was stirred f or 10 minutes at room temperature, then, the mixture was reacted at 60° C. for 12 hours. This reaction was conducted in an argon gas atmosphere. After the reaction, this solution was cooled, then, poured into a mixed solution of 10 ml of 25% ammonia water, 200 ml of methanol and 50 ml of ion exchanged water, and the mixture was stirred for about one hour. Then, the produced precipitation was filtrated and recovered. This precipitation was dried, then, dissolved in chloroform. This solution was filtrated to remove undissolved materials, then, this solution was poured into methanol to cause re-precipitation, and the produced precipitation was recovered. This precipitation was dried under reduced pressure to obtain 0.1 g of a polymer.

This polymer had a polystyrene reduced weight-average molecular weight of 1. 4×10$^5$, and a polystyrene reduced number-average molecular weight of 4.4×10$^4$.

The structure and the molar ratio of repeating units of the polymeric fluorescent substance 15 expected from the charged monomers are as shown below.

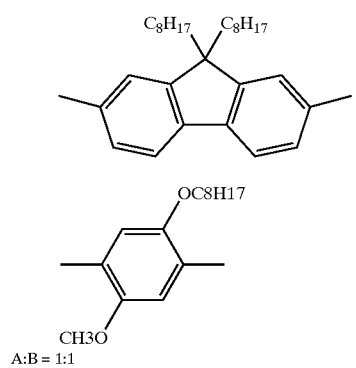

A:B = 1:1

Example 14
<Synthesis of Polymeric Fluorescent Substance 16>

0.882 g of 1,4-dibromo-2,5-di(3,7-dimethyloctyloxy) benzene and 0.55 g of 2,2'-bipyridyl were charged into a reaction vessel, then, an atmosphere in the reaction system was purged with an argon gas. To this was added 35 ml of tetrahydrofuran degassed by bubbling with an argon gas (dehydrated). Then, to this mixed solution was added 0.96 g of bis(1,5-cyclooctadiene)nickel (0), and the mixture was stirred for 10 minutes at room temperature, then, the mixture was reacted at 60° C. for 8 hours. This reaction was conducted in an argon gas atmosphere. After the reaction, this solution was cooled, then, poured into a mixed solution of 10 ml of 25% ammonia water, 200 ml of methanol and 50 ml of ion exchanged water, and the mixture was stirred for about one hour. Then, the produced precipitation was filtrated and recovered. This precipitation was dried, then, dissolved in chloroform. This solution was filtrated to remove undissolved materials, then, this solution was poured into methanol to cause re-precipitation, and the produced precipitation was recovered. This precipitation was dried under reduced pressure to obtain 0.12 g of a polymer.

This polymer had a polystyrene reduced weight-average molecular weight of 7.8×10$^4$, and a polystyrene reduced number-average molecular weight of 2.8×10$^4$.

The repeating unit expected from the charged monomers is as shown below.

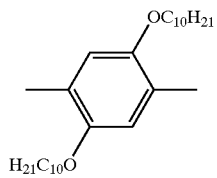

Example 15
<Synthesis of Polymeric Fluorescent Substance 17>

0.59 g of 9,9-dioctyl-2,7-dibromofluorene and 0.506 g of N-phenyl-2,7-dibromocarbazole were charged into a reaction vessel, then, an atmosphere in the reaction system was purged with an argon gas. To this was added 35 ml of tetrahydrofuran degassed by bubbling with an argon gas (dehydrated solvent). Then, to this mixed solution was added 0.97 g of bis (1,5-cyclooctadiene)nickel (0), and the mixture was stirred for 10 minutes at room temperature, then, the mixture was reacted at 60° C. for 3 hours. This reaction was conducted in an argon gas atmosphere. After the reaction, this solution was cooled, then, poured into a mixed solution of 10 ml of 25% ammonia water, 200 ml of methanol and 50 ml of ion exchanged water, and the mixture was stirred for about one hour. Then, the produced precipitation was filtrated and recovered. This precipitation was dried, then, dissolved into toluene. This solution was filtrated to remove undissolved materials, then, this solution was poured into methanol to cause re-precipitation, and the produced precipitation was recovered. This precipitation was dried under reduced pressure to obtain 0.05 g of a polymer.

This polymer had a polystyrene reduced weight-average molecular weight of 8.4×10$^4$, and a polystyrene reduced number-average molecular weight of 3.0×10$^4$.

Example 16
<Synthesis of Polymeric Fluorescent Substances 18-28>

Polymeric fluorescent substances 18–28 were obtained as the same manner with Example 15 except that monomers and Ni (COD)$_2$/monomers (mol/mol) shown in Table 2 were used.

The polymeric fluorescent substance obtained by the method of the present invention is a polyarylene-based polymeric fluorescent substance having a high molecular weight, and can be suitably used as a fluorescent material for a polymer LED and laser dye. A polymer LED using the polymeric fluorescent substance can be driven at lower voltage with high efficiency. Therefore, this polymer LED can be preferably used as a back light of a liquid crystal display, a light source in the form of curved surface or flat surface for illumination, or a display device of segment type, and in apparatuses such as a flat panel display of dot matrix, and the like.

TABLE 2

| Polymeric fluorescent substance | Monomer 1 |
|---|---|
| 17 | 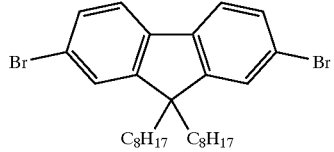 |
| 18 | 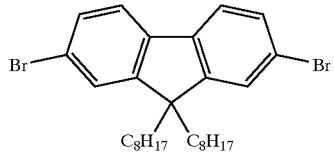 |
| 19 | 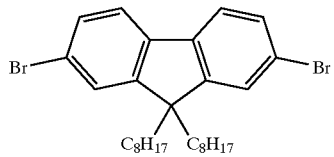 |
| 20 | 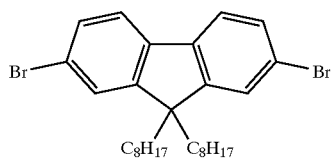 |
| 21 | 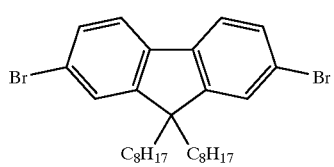 |
| 22 | 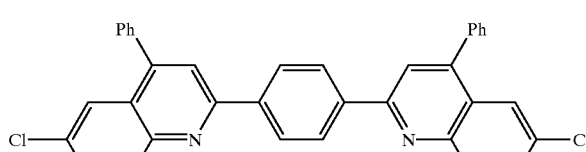 |
| 23 | 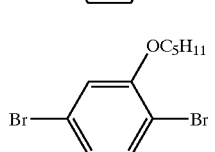 |
| 24 | 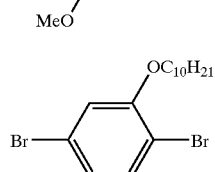 |

TABLE 2-continued
| | |
|---|---|
| 25 | 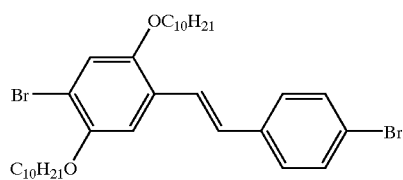 |
| 26 | 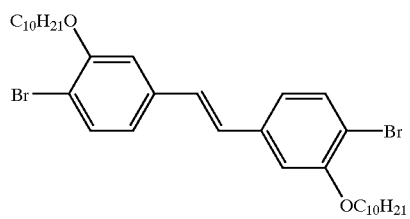 |
| 27 | 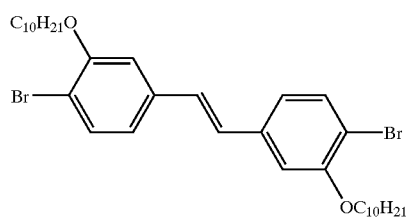 |
| 28 | 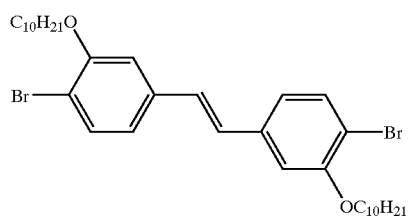 |
| Polymeric fluorescent substance | Monomer 2 |
|---|---|
| 17 | 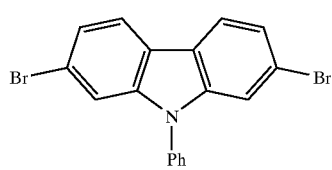 |
| 18 | 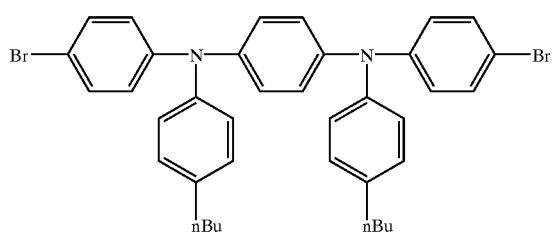 |
| 19 | 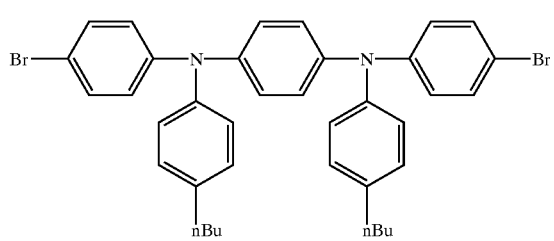 |

TABLE 2-continued
| 20 | 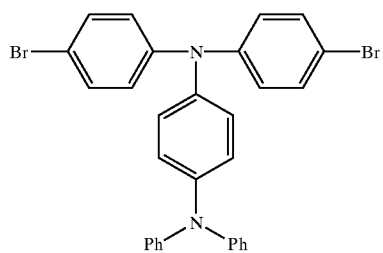 |
| 21 | 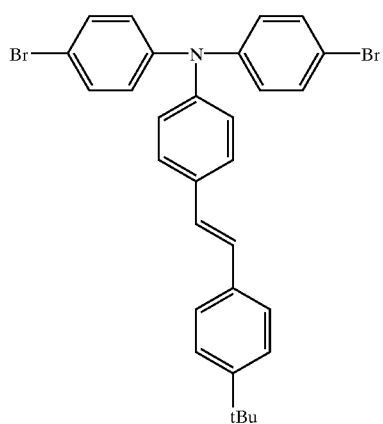 |
| 22 | 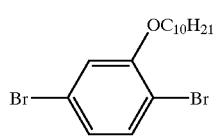 |
| 23 | 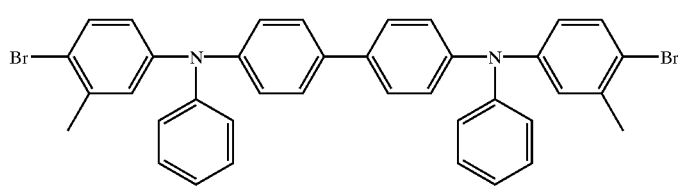 |
| 24 | 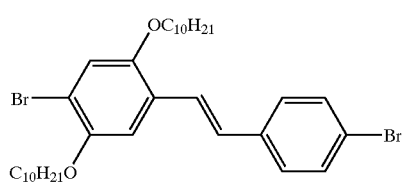 |
| 25 | |
| 26 | 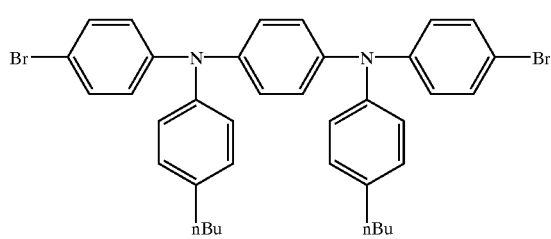 |

TABLE 2-continued
| | |
|---|---|
| 27 | 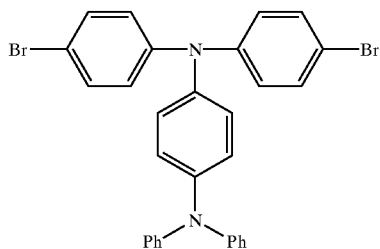 |
| 28 | 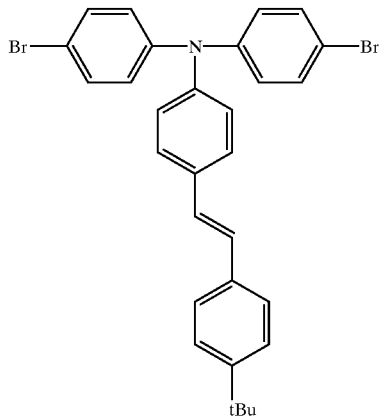 |
| Polymeric fluorescent substance | Monomer 3 | Molar ratio*[1] | Solvent | Ni(COD)$_2$/ Monomers (mol/mol) | Weight-average molecular weight |
|---|---|---|---|---|---|
| 17 | | 7:3:0 | THF | 2.3 | 84,000 |
| 18 | ![Monomer with iBu group: Br-C6H4-N(C6H4-Br)-C6H4-iBu] | 8:1:1 | THF | 2.5 | 164,000 |
| 19 | | 7:3:0 | THF | 2.5 | 301,000 |
| 20 | | 9:1:0 | THF | 4.1 | 420,000 |
| 21 | | 7:3:0 | THF | 2.5 | 120,000 |
| 22 | ![Monomer with two nBu groups] | 35:35:30 | THF | 3.1 | 69,000 |
| 23 | | 3:1:0 | THF | 2.4 | 121,800 |
| 24 | | 1:1:0 | THF | 2.4 | 360,000 |
| 25 | | 1:0:0 | THF | 2.4 | 410,000 |
| 26 | | 7:3:0 | THF | 2.5 | 455,000 |
| 27 | | 7:3:0 | THF | 3.0 | 440,000 |
| 28 | | 7:3:0 | THF | 2.4 | 150,000 |
*[1] Molar ratio of the monomers, Monomer 1:Monomer 2:Monomer 3

What is claimed is:

1. A method of producing a polymeric fluorescent substance wherein one or more monomers represented by the general formula (1) are polymerized in a solvent containing one or more aromatic hydrocarbon solvents and/or ether solvents in the presence of a zerovalent nickel complex in an amount of 1.8 mol or more based on 1 mol of said monomers, $$X_1\text{—}Ar_1\text{—}X_2 \qquad (1)$$

wherein, $Ar_1$ represents a divalent groups selected from the group consisting of arylene groups, divalent heterocyclic compound groups, and divalent or trivalent hetero atom-bonded arylene or divalent heterocyclic compound groups; $Ar_1$ may have one or more substituents; $X_1$ and $X_2$ represent leaving groups which may be the same or different, and
wherein the substance has a polystyrene reduced weight-average molecular weight of $6 \times 10^4$ or more.

2. The method of producing a polymeric fluorescent substance according to claim 1 wherein the zerovalent nickel complex is used in an amount of 2.1 mol or more based on 1 mol of said monomers.

3. The method of producing a polymeric fluorescent substance according to claim 1 or 2 wherein $X_1$ and/or $X_2$ in the formula (1) is a halogen atom, an alkylsulfonyloxy group which may be substituted by one or more fluorine atoms, or an arylsulfonyloxy groups which may be substituted by one or more alkyl groups.

4. The method of producing a polymeric fluorescent substance according to claim 1 or 2, wherein the aromatic hydrocarbon solvent is toluene and the zerovalent nickel complex is bis(1,5-cyclooctadiene)nickel (0).

5. The method of producing a polymeric fluorescent substance according to claim 1 or 2, wherein the ether solvent is tetrahydrofuran and the zerovalent nickel complex is bis(1,5-cyclooctadiene)nickel (0).

6. The method of producing a polymeric fluorescent substance according to claim 4 wherein the amount of the monomers of the formula (1) is 0.05% by weight or more and 40% by weight or less based on 100% by weight of the total amount of the monomers, solvent and zerovalent nickel complex.

7. The method of producing a polymeric fluorescent substance according to claim 5 wherein the amount of the monomers of the fomula (1) is 0.05% by weight or more and 40% by weight or less based on 100% by weight of the total amount of the monomers, solvent and zerovalent nickel complex.

8. A polymeric fluorescent substance produced by the method according to claim 1 or 2.

9. The polymeric fluorescent substance according to claim 8 wherein said substance is a copolymer produced by using two or more kinds of monomers.

10. The polymeric fluorescent substance according to claim 8, wherein the substance contains both of the partial structures represented by -A-A- and -B-B- in the copolymer, provided that a repeating unit derived from a monomer used in the largest amount is referred to as A, a repeating unit derived from a monomer used in the second largest amount is referred to as B.

11. The polymeric fluorescent substance according to claim 8, wherein at least one monomer has a structure of aromatic amine.

12. A polymer light-emitting device having at least a light-emitting layer between a pair of electrodes composed of an anode and a cathode at least one of which is transparent or semitransparent, wherein said light-emitting layer contains the polymeric fluorescent substance according to claim 8.

13. The polymer light-emitting device according to claim 12 wherein a layer made of an electron-transporting compound is provided adjacent to said light-emitting layer between the cathode and the light emitting layer.

14. The polymer light-emitting device according to claim 12 wherein a layer made of a hole-transporting compound is provided adjacent to said light-emitting layer between the anode and the light emitting layer.

15. The polymer light-emitting device according to claim 12 wherein a layer made of an electron-transporting compound is provided adjacent to said light-emitting layer between the cathode and the light emitting layer, and a layer made of a hole-transporting compound is provided adjacent to said light-emitting layer between the anode and the light emitting layer.

16. A sheet light source comprising the polymer light-emitting device according to claim 12.

17. A segment display comprising the polymer light-emitting device according to claim 12.

18. A dot matrix display comprising the polymer light-emitting device according to claim 12.

19. A liquid crystal display comprising the polymer light-emitting device according to claim 12 as a back light.

20. The method of producing a polymeric fluorescent substance according to claim 3, wherein the aromatic hydrocarbon solvent is toluene and the zerovalent nickel complex is bis(1,5-cyclooctadiene)nickel (0).

21. The method of producing a polymeric fluorescent substance according to claim 3, wherein the ether solvent is tetrahydrofuran and the zerovalent nickel complex is bis(1,5-cyclooctadiene)nickel (0).

22. A polymeric fluorescent substance produced by the method according to claim 3.

23. A polymeric fluorescent substance produced by the method according to claim 4.

24. A polymeric fluorescent substance produced by the method according to claim 5.

25. A polymeric fluorescent substance produced by the method according to claim 6.

26. The polymeric fluorescent substance according to claim 9, wherein the substance contains both of the partial structures represented by -A-A- and -B-B- in the copolymer, provided that a repeating unit derived from a monomer used in the largest amount is referred to as A, a repeating unit derived from a monomer used in the second largest amount is referred to as B.

27. The polymeric fluorescent substance according to claim 9, wherein at least one monomer has a structure of aromatic amine.

28. The polymeric fluorescent substance according to claim 10, wherein at least one monomer has a structure of aromatic amine.

29. A polymer light-emitting device having at least a light-emitting layer between a pair of electrode composed of an anode and a cathode at least one of which is transparent or semitransparent, wherein said light-emitting layer contains the polymeric fluorescent substance according to claim 9.

30. A polymer light-emitting device having at lest a light-emitting layer between a pair of electrode composed of an anode and a cathode at least one of which is transparent or semitransparent, wherein said light-emitting layer contains the polymeric fluorescent substance according to claim 10.

31. A polymer light-emitting device having at lest a light-emitting layer between a pair of electrode composed of an anode and a cathode at least one of which is transparent or semitransparent, wherein said light-emitting layer contains the polymeric fluorescent substance according to claim 11.

32. A sheet light source comprising the polymer light-emitting device according to claim 13.

33. A sheet light source comprising the polymer light-emitting device according to claim 14.

34. A sheet light source comprising the polymer light-emitting device according to claim 15.

35. A segment display comprising the polymer light-emitting device according to claim 13.

36. A segment display comprising the polymer light-emitting device according to claim 14.

37. A segment display comprising the polymer light-emitting device according to claim 15.

38. A dot matrix display comprising the polymer light-emitting device according to claim 13.

39. A dot matrix display comprising the polymer light-emitting device according to claim 14.

40. A dot matrix display comprising the polymer light-emitting device according to claim 15.

41. A liquid crystal display comprising the polymer light-emitting device according to claim 13 as a back light.

42. A liquid crystal display comprising the polymer light-emitting device according to claim 14 as a back light.

43. A liquid crystal display comprising the polymer light-emitting device according to claim 15 as a back light.

* * * * *